(12) United States Patent
Tsukuda

(10) Patent No.: US 6,577,994 B1
(45) Date of Patent: Jun. 10, 2003

(54) DESIGN RULE GENERATION SYSTEM AND RECORDING MEDIUM RECORDING PROGRAM THEREOF

(75) Inventor: Eiji Tsukuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,337

(22) Filed: Dec. 9, 1999

(30) Foreign Application Priority Data

Jul. 2, 1999 (JP) .......................................... 11-189044

(51) Int. Cl.⁷ ............................ G06F 17/50; G06G 7/48
(52) U.S. Cl. ............................ 703/15; 703/16; 716/19; 382/280
(58) Field of Search .............................. 703/15, 3, 13, 703/5; 716/19; 382/144–145, 280; 430/30

(56) References Cited

U.S. PATENT DOCUMENTS 5,955,227 A    9/1999  Tsujita et al.
6,249,597 B1 * 6/2001  Tsudaka .................... 382/144

* cited by examiner

*Primary Examiner*—Samuel Broda
*Assistant Examiner*—Thai Phan
(74) *Attorney, Agent, or Firm*—Oblon, Spivak, McClelland, Maier & Neustadt, P.C.

(57) ABSTRACT

A system having a high efficiency of operation to determine a design rule and thus requiring lesser time needed in determining the design rule, is provided by automating the process of determining the design rule. The system comprises an automatic L/S pattern generation part automatically generating a L/S pattern defined by a line width and space width, an optical simulation part performing an optical simulation based on the L/S pattern and a finish prediction part in which the dimension (finished size) of a pattern formed on a resist is predicted based on the result of the optical simulation. Also included is a L/S matrix database construction part in which a L/S matrix is made based on the finish prediction result, and also constructs the data used in making the L/S matrix, as a database, and a design rule generation part generating a design rule from the L/S matrix.

9 Claims, 18 Drawing Sheets

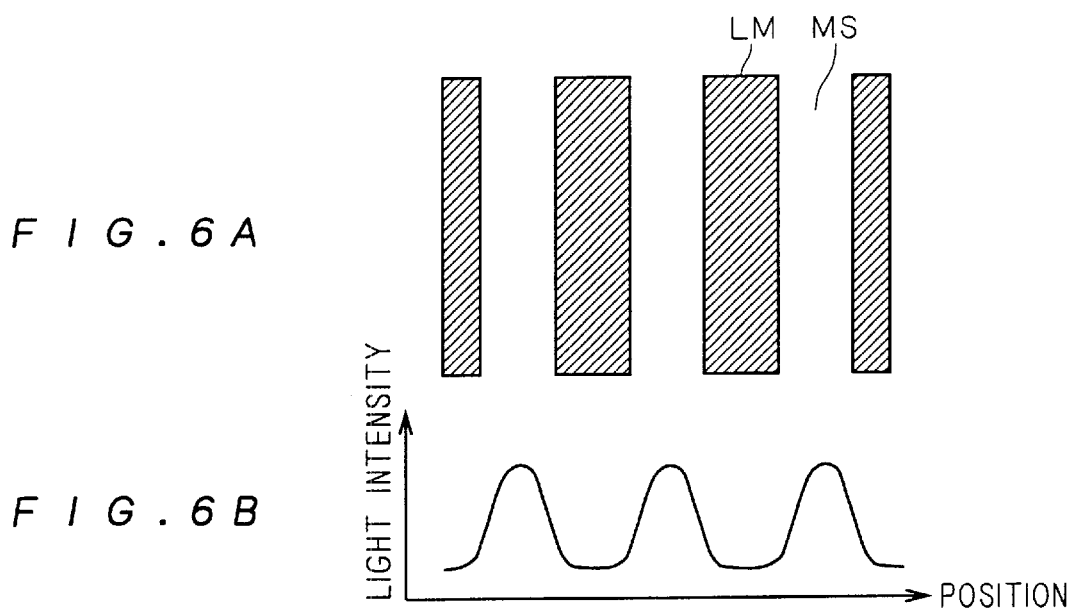
FIG.6A
FIG.6B
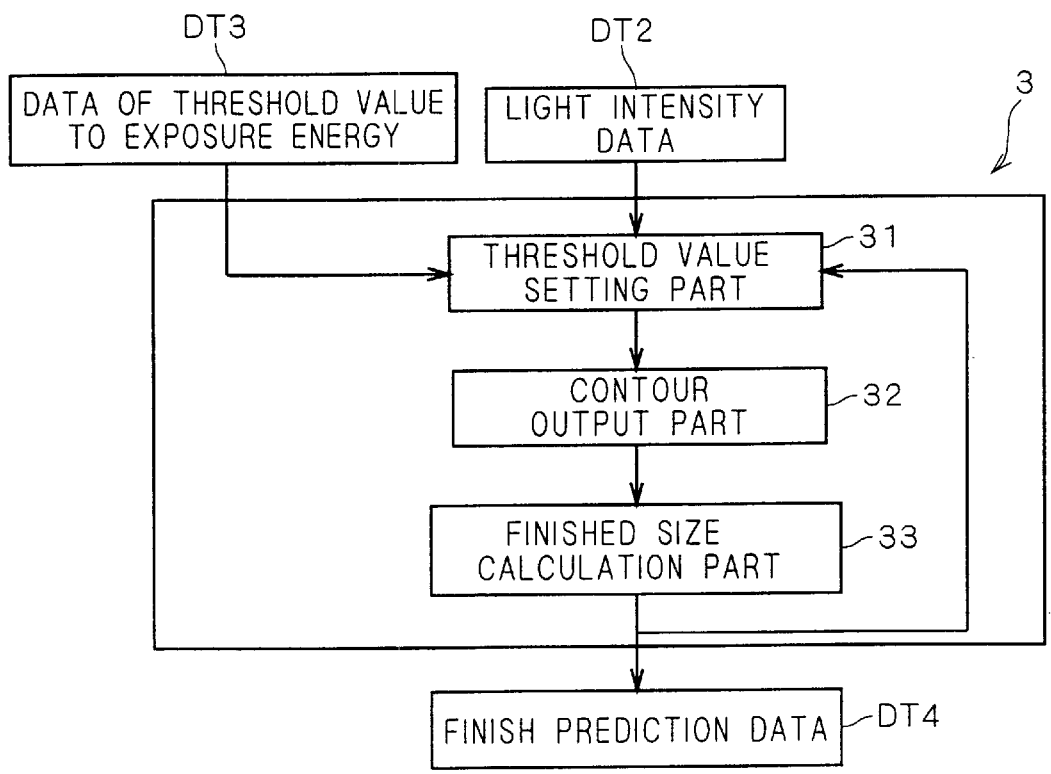
FIG.7

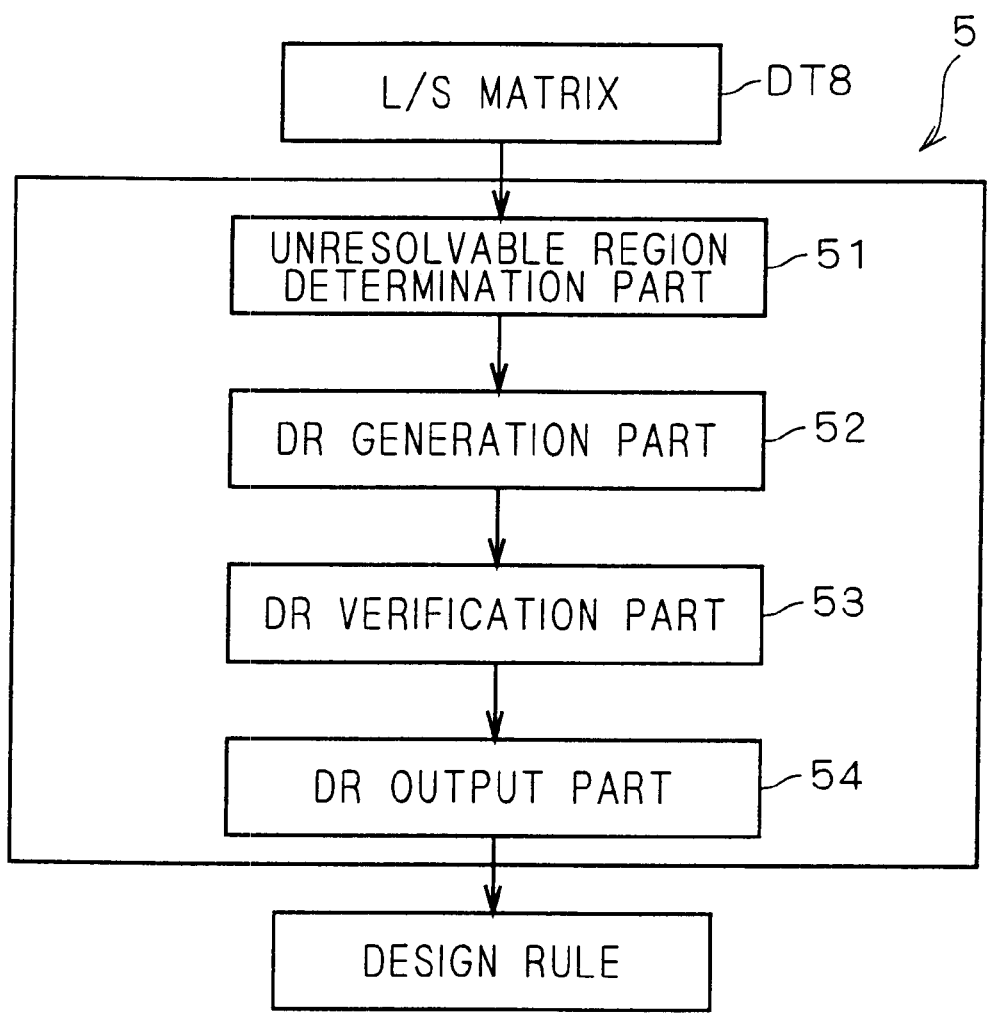
F I G . 16

F I G . 2 3
< BACKGROUND ART >
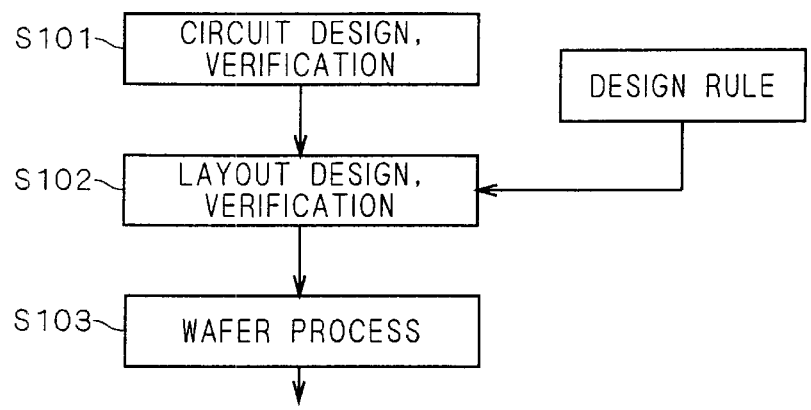
F I G . 2 4
< BACKGROUND ART >
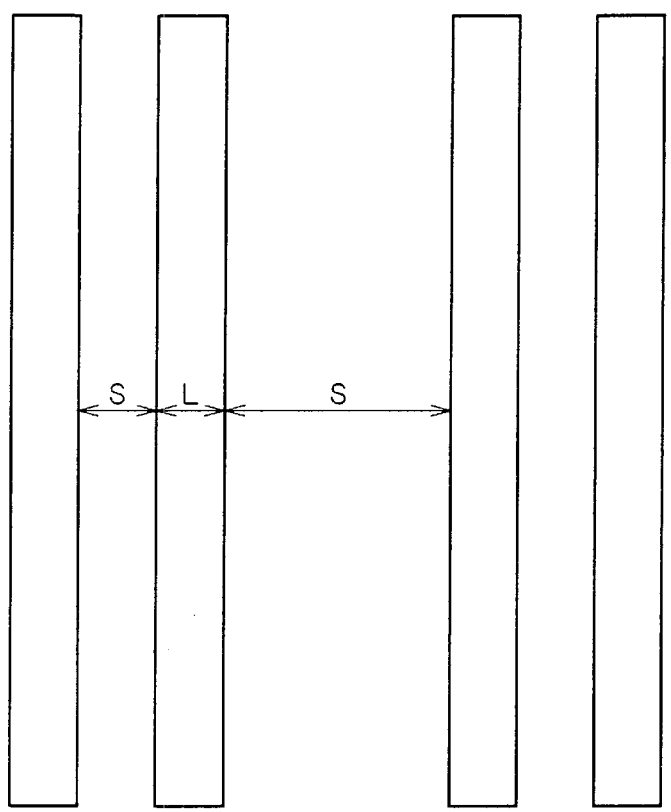

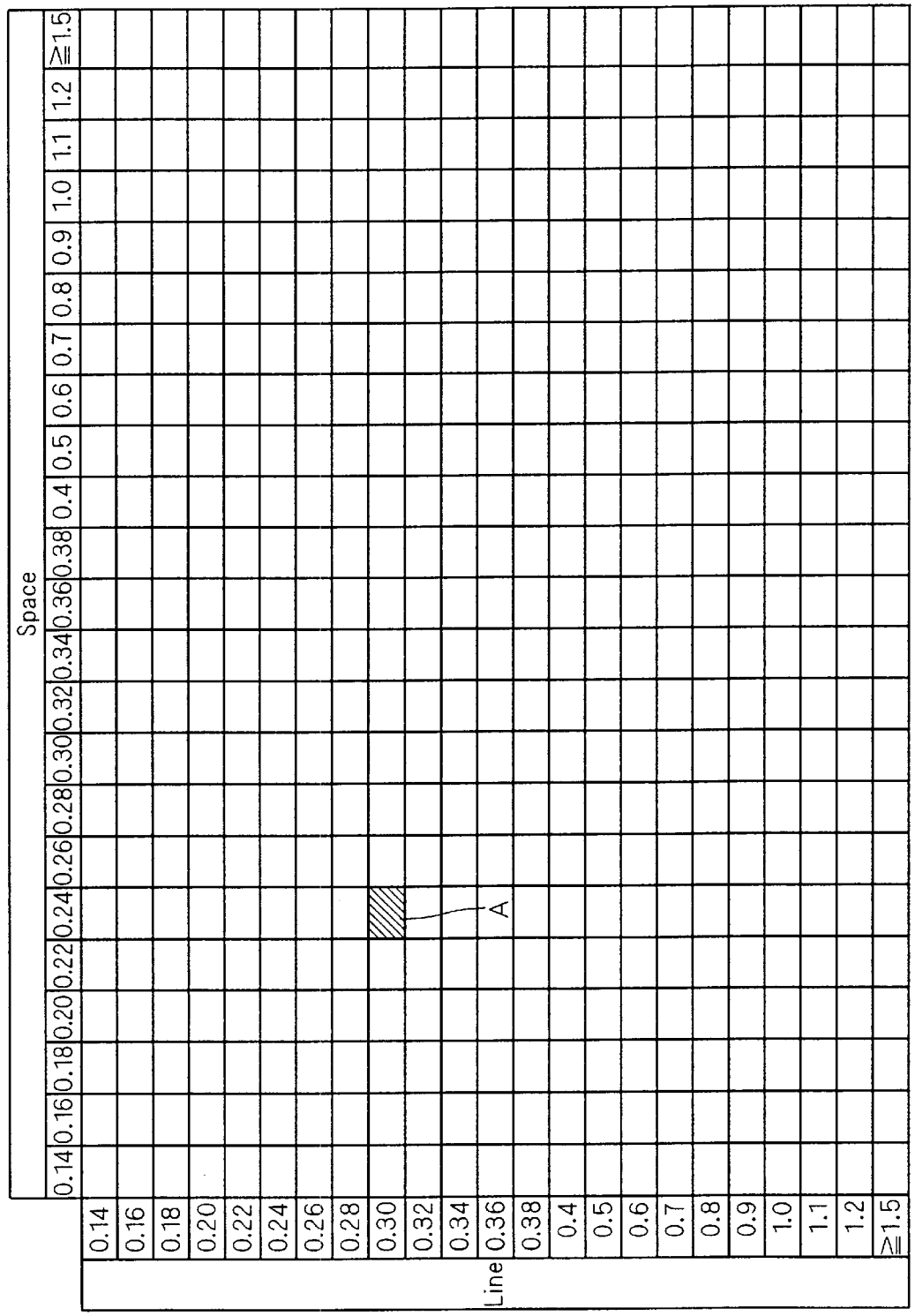
FIG. 25 <BACKGROUND ART>

F I G . 2 6
< BACKGROUND ART >
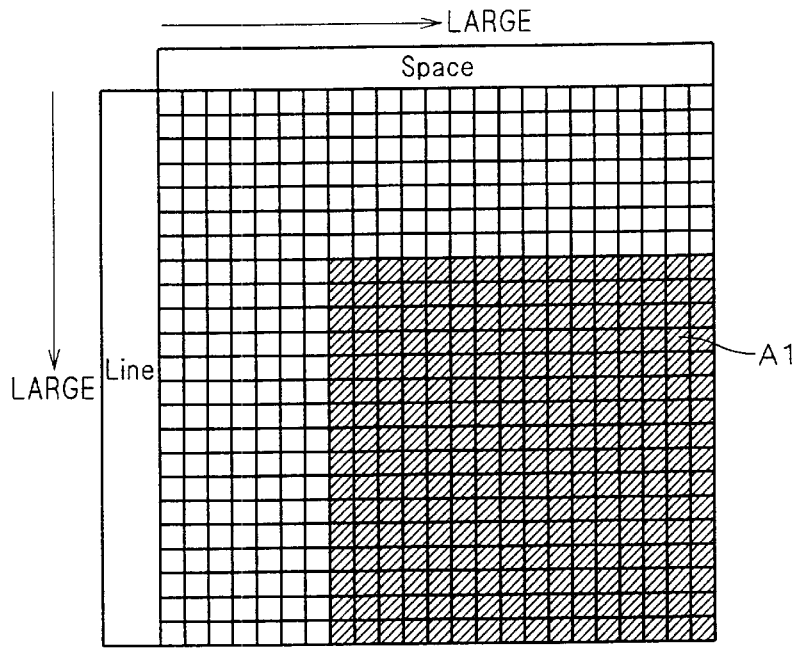
F I G . 2 7
< BACKGROUND ART >
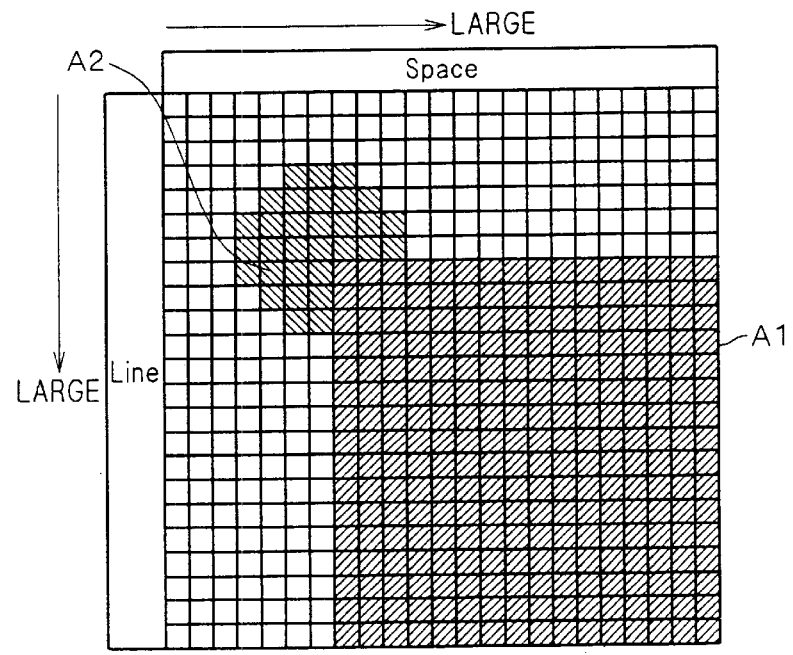

DESIGN RULE GENERATION SYSTEM AND RECORDING MEDIUM RECORDING PROGRAM THEREOF

BACKGROUND OF THE INVENTION

1. Field of the Invention

The present invention relates to a design rule generation and, in particular, a system for automatically generating a design rule and a recording medium recording a program thereof.

2. Description of the Background Art

In recent years, to comply with the high integration and miniaturization of semiconductor integrated circuits, there proceeds rapidly the miniaturization of resist patterns formed on wafers and that of mask patterns for forming the resist patterns. In photolithography technique, super resolution technique is used as one method other than shortening the wavelength of light source, for improving resolution such as to comply with the miniaturization. Examples of the super resolution technique are so-called Levenson method and modified illumination method.

In the Levenson method, by disposing a phase shifter on a mask, the resolution of a resist pattern formed on a wafer is increased to comply with the miniaturization. In the modified illumination method, by changing the shape of a light source itself, the resolution of a pattern formed on a wafer is increased to comply with the miniaturization. With these super resolution techniques, a further fine resist pattern can be formed, but there is the possibility of causing a different dimensional change than has hitherto been caused.

Specifically, in a method employing no super resolution technique, any layouts in which line width and space width are below resolution limit are prohibited, and a mask pattern is laid out such that line width and space width are not less than the resolution limit. Thereby, no large dimensional change occurs between the mask pattern and the pattern formed on a resist (finished pattern), and the dimensional change in the finished pattern falls within a predictable range. When employing a super resolution technique, line width and space width that are resolution limits can be reduced. In a certain dimensional range, however, the finished pattern size is far thick or thinner than a mask pattern, resulting in beyond a permitted limit in some cases. Further, it may on occasion be difficult to predict this. As a technique for solving this problem, optical simulation has been used in recent years.

Optical simulation is a technique for predicting the shape of a finished pattern. This enables to make a design rule (referred to simply as a "DR" in some instances) corresponding to a super resolution technique, based on the predicted shape of the finished pattern.

Now, a schematic flow chart of a semiconductor device manufacture is given in FIG. 23. In the manufacture of a semiconductor device, as shown in FIG. 23, a circuit design and its verification are performed (step S101) and, based on the designed circuit data, a layout design and its verification for determining an actual circuit pattern formed on a wafer are performed (step S102). Then, based on the layout design, a wafer process is executed (step S103). The design rule is used for the layout design and verification shown in step S102. That is, it is the rule for specifying, for example, the line width of wiring and the space width of wirings, and is restricted by wafer process.

In photolithography being one wafer process, when no super resolution technique is employed, a design rule of the same layer is relatively simple. Specifically, all required therefor is to specify a minimum line width (L) and minimum space width (S) which show the wafer process limit (e.g., a resolution limit in photolithography).

On the other hand, when a super resolution technique is employed in a wafer process, a complicated design rule is required to comply with the super resolution technique. For example, in forming a wiring pattern having various space widths S, as shown in FIG. 24, it is insufficient only by specifying a minimum line width L and minimum space width S, and thus required to determine whether resolution is executable or not in a combination of a line width and space width, namely, whether the finished pattern size exceeds a permitted limit or not.

Then, for satisfying this requirement, a method of making a matrix table as shown in FIG. 25, has been taken. FIG. 25 shows a so-called L/S matrix that is a table in which various numerical values of line width and space width of a wiring pattern are disposed vertically and laterally, respectively, in order to make understandable a plurality of combinations of line width and space width.

Referring to FIG. 25, disposed vertically are the numerical values of line width L (unit: $\mu$m). These are disposed at intervals of 0.02 $\mu$m in the range from 0.14 $\mu$m to 0.4 $\mu$m, at intervals of 0.1 $\mu$m in the range from 0.4 $\mu$m to 1.2 $\mu$m, and the last numerical value is 1.5 $\mu$m or more. Disposed laterally are the numerical values of space width S. These are disposed at intervals of 0.02 $\mu$m in the range from 0.14 $\mu$m to 0.4 $\mu$m, at intervals of 0.1 $\mu$m in the range from 0.4 $\mu$m to 1.2 $\mu$m, and the last numerical value is 1.5 $\mu$m or more. In this table, for instance, region A covers the line width L of 0.30 $\mu$m to 0.32 $\mu$m, and the space width of 0.24 $\mu$m to 0.26 $\mu$m.

Referring now to FIGS. 26 and 27, a method of using a L/S matrix is described. FIGS. 26 and 27 express the L/S matrix of FIG. 25, for general purpose. Although no specific values of line width L and space width S are indicated, it is set such that line width L increases as it moves downward in the vertical direction, and space width S increases as it moves rightward in the lateral direction.

FIG. 26 is a table illustrating the resolvability based on the calculation result obtained by optical simulation, when no super resolution technique is employed. Region A1 of the hatched part corresponds to the region covering combinations of line width and space width, with which an optical image of a pattern defined by lines and spaces is resolvable on an image surface of an optical system in photolithography, e.g., on a resist.

The region A1 is of a simple rectangle. Thus, it will be apparent that the region A1 can be specified as a design rule, merely by specifying the minimum line width and minimum space width which show a resolution limit in photolithography.

On the other hand, FIG. 27 is a table illustrating the resolvability based on the calculation result obtained by optical simulation, when the modified illumination method is employed as a super resolution technique. Regions A1 and A2 of the hatched part correspond to the region covering combinations of line width and space width, with which an optical image of a pattern defined by lines and spaces is resolvable on a resist. The region A2 is such a region that surrounds the corner of the region A1, and is a peculiar result when used an aperture for annular illumination in the modified illumination method. It will be apparent that the shape of the resolvable region is complicated by the presence of the region A2, thus requiring a complicated rule for specifying that region as a design rule.

As described in the foregoing, when the super resolution technique is employed in a wafer process in order to comply with the high integration and miniaturization of semiconductor integrated circuits, a complicated design rule is required for complying with the super resolution technique. Hitherto, the design rule has been obtained by the following manner. That is, the designer sequentially makes an optical simulation to various combinations of line width L and space width S, to make a L/S matrix, and determines whether resolution is executable or not, in the respective combinations of line width and space width, by using the L/S matrix. Based on the results, a design rule is determined empirically. Thus, the efficiency of operation to determine a design rule is poor, and a long time is required to determine the design rule. Further, it is impossible to make determination for all the combinations, and thus limited to checking of every important point.

SUMMARY OF THE INVENTION

According to a first aspect of the present invention, a design rule generation system comprises: (a) an automatic wiring pattern generation part that automatically generates a wiring pattern comprised of a combination of a wiring width and a space width between the wirings; (b) an optical simulation part that performs an optical simulation under a condition of printing the wiring pattern on an object, and outputs data of an exposed light on the object; (c) a finish prediction part that predicts a finished size of the wiring pattern to be formed on the object, based on the data of the exposed light; (d) a matrix database construction part that records, on a data table in the form of a matrix, resolvability of a plurality of the wiring patterns having different combination of the wiring width and the space width which are obtained by repeating the respective operations in the parts (a) to (c); judges whether the finished size satisfies a predetermined condition or not, so that it is determined the wiring patterns are resolvable if the predetermined condition is satisfied, and determined the wiring patterns are unresolvable unless the predetermined condition is satisfied; and records the resolvability of the wiring pattern on the data table, so as to correspond respectively to the combinations of the wiring width and the space width; and (e) a design rule generation part that generates a design rule by defining a range of a resolvable region comprised of a set of the wiring patterns being resolvable, or an unresolvable region comprised of a set of the wiring patterns being unresolvable, based on the data table.

According to a second aspect, the design rule generation system of the first aspect is characterized in that the data of the exposed light outputted from the optical simulation part is data showing a light intensity distribution corresponding to a position on the object; the finish prediction part sets a predetermined light intensity in the light intensity distribution, as a threshold value, and employs a section width obtained by slicing the light intensity distribution with the threshold value, as the finished size; and the matrix database construction part determines resolvability of the wiring pattern by determining whether the section width is contained in a size obtained by summing the wiring width, the space width and a predefined allowed variational value.

According to a third aspect, the design rule generation system of the first aspect is characterized in that the matrix database construction part contains at least an exposure margin and defocus margin, as a criterion of determining resolvability of the wiring pattern.

According to a fourth aspect, the design rule generation system of the third aspect is characterized in that the data of the exposed light outputted from the optical simulation part is data showing a light intensity distribution corresponding to a position of the object; the finish prediction part sets a plurality of light intensity values in the light intensity distribution as a plurality of threshold values, respectively, and acquires a plurality of section widths by slicing the light intensity distribution with the threshold values; and the matrix database construction part determines resolvability of the wiring pattern by finding, out of the section widths, ones which fall within a range of a dimension obtained by summing the wiring width, the space width and a predefined allowed variational value, finding an allowed variational exposure energy from a range of threshold values corresponding to the section widths, and determining whether the allowed variational exposure energy is contained in the exposure margin.

According to a fifth aspect, the design rule generation system of the third aspect is characterized in that the optical simulation part performs the optical simulation under a plurality of defocus conditions, to output data showing a plurality of light intensity distributions which correspond to the defocus conditions, respectively, and correspond to a position on the object; the finish prediction part sets a predetermined light intensity in the light intensity distributions, as a threshold value, and acquires a plurality of section widths by slicing the light intensity distributions with the threshold value; the matrix database construction part determines resolvability of the wiring pattern by finding, out of the section widths, ones which fall within a range of a size obtained by summing the wiring width, the space width and a predefined allowed variational value, finding an allowed variational defocus amount from a range of defocus conditions corresponding to the section widths, and determining whether the allowed variational defocus amount is contained in the defocus margin.

According to a sixth aspect, the design rule generation system of the first aspect is characterized in that the automatic wiring pattern generation part generates a wiring pattern of oblique lines in which the wiring and the space are disposed obliquely on a plain at a predetermined angle.

According to a seventh aspect, the design rule generation system of the first aspect is characterized in that the automatic wiring pattern generation part generates a hole pattern in which the wiring width and the space width are employed as the diameter of holes and the space width between the holes, respectively.

According to an eighth aspect, the design rule generation system of the third aspect is characterized in that the matrix database construction part contains the presence/absence of a dimple occurred in the space between holes, as a criterion of determining resolvability of the wiring pattern.

According to a ninth aspect, a recording medium records a program for realizing on a computer the following functions: (a) an automatic wiring pattern generation function of automatically generating a wiring pattern comprised of a combination of a wiring width and a space width between the wirings; (b) an optical simulation function of performing an optical simulation under a condition of printing the wiring patter on an object, and outputting data related to an exposed light on the object; (c) a finish prediction function of predicting a finished size of the wiring pattern to be formed on the object, based on the data of the exposed light; (d) a matrix database construction function of recording, on a data table in the form of a matrix, resolvability of a plurality of the wiring patterns having different combination of the wiring width and the space width to be obtained by executing repetitively the functions (a) to (c); judging whether the finished size satisfies a predetermined condition or not, so that it is determined the wiring patterns are resolvable if the predetermined condition is satisfied, and determined the wiring patterns are unresolvable unless the predetermined condition is satisfied; and recording the resolvability of the wiring patterns on the data table, so as to correspond respectively to the combinations of the wiring width and the space width; and (e) a design rule generation function of generating a design rule by defining a range of a resolvable region comprised of a set of the wiring patterns being resolvable, or an unresolvable region comprised of a set of the wiring patterns being unresolvable, based on the data table.

The design rule generation system of the first aspect offers the following advantage. Specifically, in a conventional manner to obtain a design rule, the designer sequentially makes an optical simulation to various combinations of line width and space width, to make a L/S matrix, and then determines whether resolution is executable or not in the respective combinations of line width and space width, by using the L/S matrix. Based on the results, a design rule is determined empirically. On the other hand, with the design rule generation system of the first aspect, a L/S matrix in the form of a matrix can be automatically generated and a design rule can be automatically determined. This increases the efficiency of operation for determining the design rule, and reduces the time needed in determining the design rule.

With the design rule generation system of the second aspect, a finished size can be obtained at high precision, for example, by previously making certain of the association between the exposure energy and threshold value, with measurements and optical simulations, and employing, as a finished size, a section width which is obtained by slicing a light intensity distribution with a threshold value corresponding to the real exposure energy.

With the design rule generation system of the third aspect, a design rule suited for the real wafer process in which exposure energy might change and defocus might occur, can be obtained because at least one of an exposure margin and defocus margin is contained as a criterion of determining the resolvability of a wiring pattern, in the matrix database construction part.

The design rule generation system of the fourth aspect enables to obtain a specific method of considering an exposure margin, and a design rule suited for the real wafer process involving the variation in exposure energy.

The design rule generation system of the fifth aspect enables to obtain a specific method of considering a defocus margin, and a design rule suited for the real wafer process involving the variation in defocus amount.

The design rule generation system of the sixth aspect, a design rule of a wiring pattern of oblique lines can be obtained by generating a wiring pattern of oblique lines in which wirings and spaces are disposed obliquely on a plain at a predetermined angle, in the automatic wiring pattern generation part.

With the design rule generation system of the seventh aspect, a design rule of a hole pattern can be obtained by generating, in the automatic wiring pattern generation part, a hole pattern in which the wiring width and space width are taken as the diameter of holes and the space width between holes, respectively.

With the design rule generation system of the eighth aspect, a design rule taking the presence/absence of a dimple into consideration can be obtained because the presence/absence of a dimple occurred in space between holes is contained as a criterion of determining the resolvability of a wiring pattern, in the matrix database construction part.

With the recording medium of the ninth aspect, a data table in the form of a matrix can be automatically made by executing, on a computer, the program recorded in the recording medium, and a design rule can be determined automatically. This increases the efficiency of operation for determining the design rule, and reduces the time needed in determining the design rule.

In view of solving the foregoing problems, an object of the invention is to provide a system in which a design rule determination process is automated to increase the efficiency of operation for determining a design rule, thus requiring lesser time needed in determining the design rule.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are schematic views illustrating operation of the design rule generation system;

FIG. 7 is a diagram illustrating the construction of another design rule generation system according to the invention;

FIG. 16 is a diagram illustrating the construction of another design rule generation system according to the invention;

FIG. 23 is a diagram illustrating a flow of manufacturing steps of a semiconductor device;

FIG. 24 is a diagram illustrating a layout pattern;

FIG. 25 is a diagram illustrating a L/S matrix;

FIG. 26 is a diagram illustrating a form of utilizing a L/S matrix; and

FIG. 27 is a diagram illustrating another form of utilizing a L/S matrix.

DESCRIPTION OF THE PREFERRED EMBODIMENTS

<A. Overall System Construction>

Figure 1:
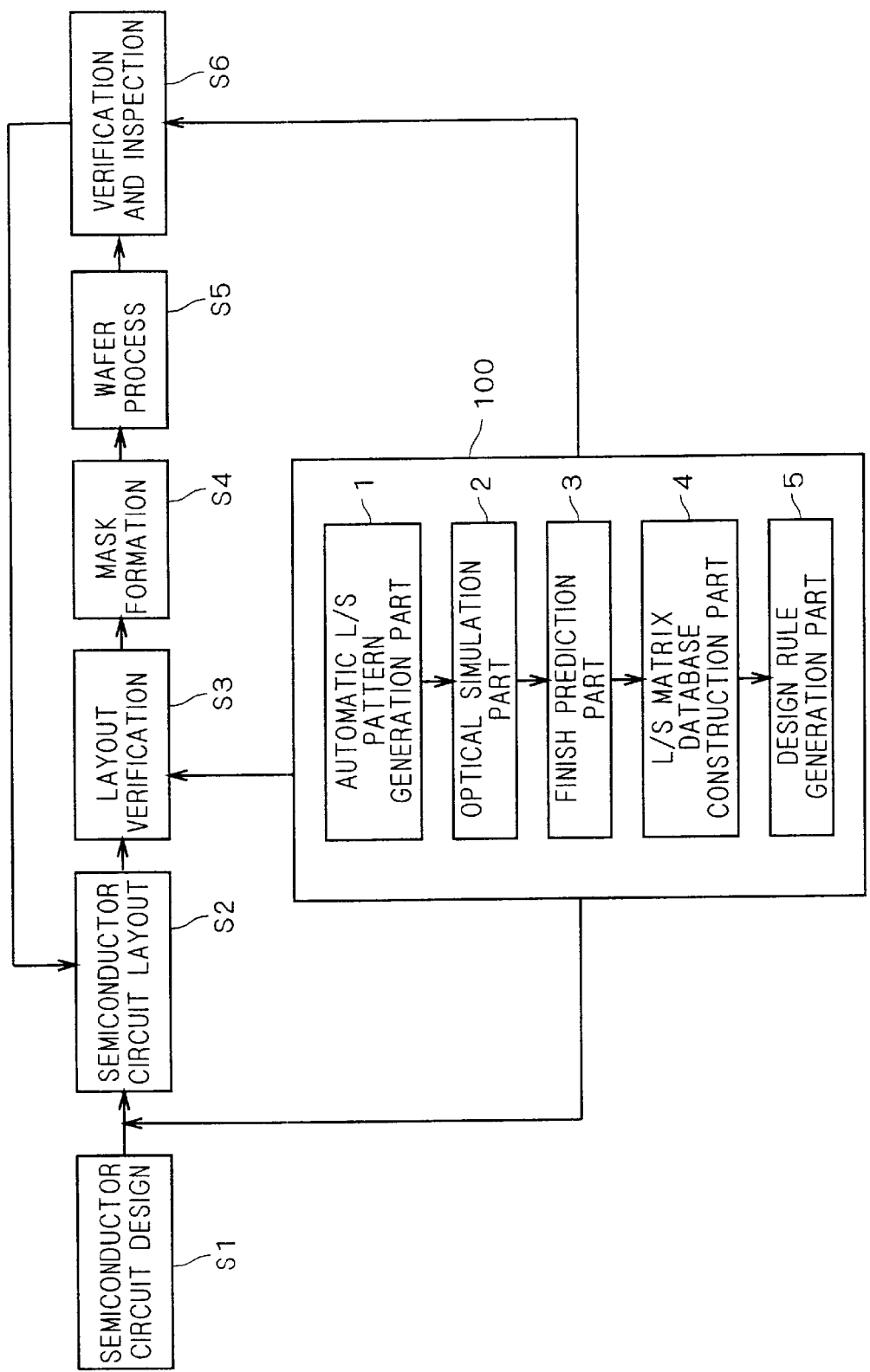
FIG. 1 is a diagram illustrating the location of a design rule generation system according to the invention.

FIG. 1 is a diagram illustrating the location of a design rule generation system according to the invention, in the manufacturing steps of a semiconductor device. Referring now to FIG. 1, a sequence of operation of manufacturing steps of a semiconductor device is described schematically.

In manufacturing a semiconductor device, as shown in FIG. 1, a semiconductor circuit is designed (step S1), and a layout design of an actual semiconductor circuit pattern to be formed on a wafer is designed based on the designed circuit data (step S2). Then, a layout verification, e.g., design rule check (DRC), is performed for the generated layout data (step S3) and, if an error part occurs, a correction of layout is performed. Thereafter, based on the layout data, a mask for photolithography is formed (step S4), and a wafer process is performed by using the obtained mask (step S5). The manufactured semiconductor device is then subjected to verification and inspection (step S6). If there is the problem caused by the mask pattern, it returns to step S2 for performing again a layout of a semiconductor circuit pattern. In the mentioned manufacturing steps of a semiconductor device, a design rule generation system 100 serves as a means for automatically generating a design rule used in a layout design of a semiconductor circuit pattern in step S2.

Note that the generated design rule is also used in the layout verification in step S3 and in the verification and inspection of the manufactured semiconductor circuit in step S6.

The design rule generation system 100 is defined by line width (L) and space width (S). The system 100 comprises an automatic L/S pattern generation part 1 automatically generating a L/S pattern, which is the base of all layout patterns; an optical simulation part 2 performing an optical simulation based on the L/S pattern generated in the automatic L/S pattern generation part 1; a finish prediction part 3 in which the dimension (finished size) of a pattern formed on a resist (finished pattern) is predicted based on the result of the optical simulation; a L/S matrix database construction part 4 in which a L/S matrix is made based on the finish prediction result, and also constructs the data used in making the L/S matrix, as a database; and a design rule generation part 5 for generating a design rule from the obtained L/S matrix.

The steps of generating a design rule with the design rule generation system 100 is described by explaining operation of the mentioned respective components in sequence.

<A-1. Operation of Automatic L/S Pattern Generation Part>

Figure 2:
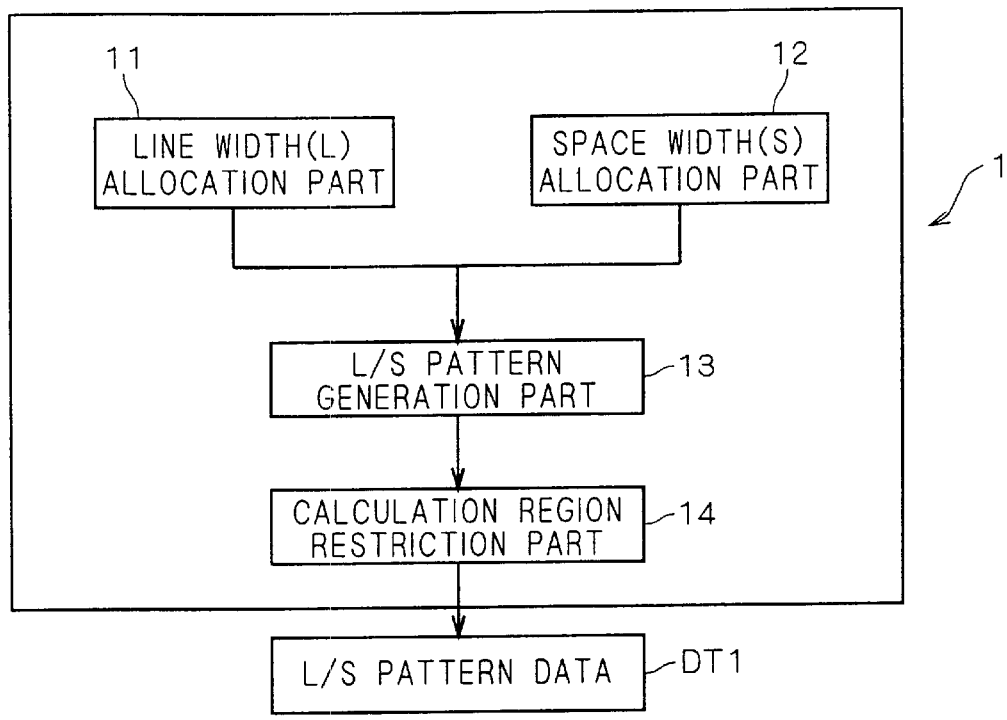
FIG. 2 is a diagram illustrating the construction of the design rule generation system.

FIG. 2 is a block diagram of the construction of an automatic L/S pattern generation part 1. As shown in FIG. 2, the automatic L/S pattern generation part 1 has a line width allocation part 11 and space width allocation part 12 which generate various line widths and space widths based on a predetermined rule, respectively.

Its operation is executed on a relatively simple rule. For example, minimum and maximum values of line width are determined, and the numerical values are arrayed such that they are increased at relatively short intervals, e.g., at intervals of 0.02 μm, in the range from the minimum value to a predetermined value, and increased at intervals of 0.1 μm, in the range from the predetermined value to the maximum value. Here, because the interval of the numerical values depends upon the magnitude of a L/S matrix, namely, the set number of matrixes, it is constructed such as to link to the setting of the magnitude of the L/S matrix.

After allocating the numerical values of line width and space width to the L/S matrix, L/S patterns for the respective combinations of line width and space width are generated in a L/S pattern generation part 13.

Figure 3:
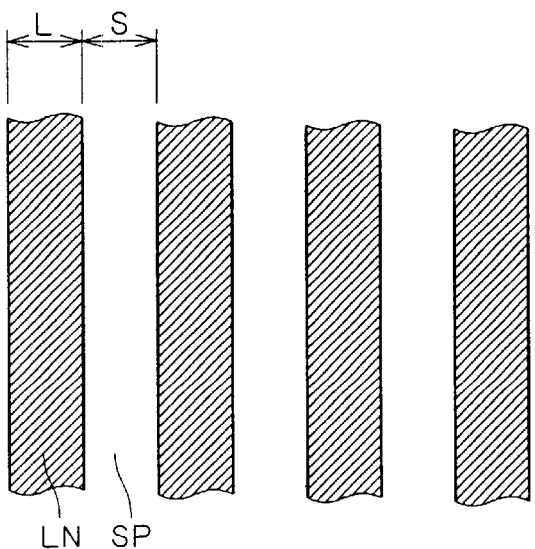
FIGS. 3 and 4 are schematic views illustrating operation of the design rule generation system.

FIG. 3 shows schematically an example of a L/S pattern, and it gives a pattern in which line width L of lines LN and space width S therebetween are the same.

It is regarded that in the L/S pattern, the line LN having no limitations in number and length is repetitively arrayed at the space width S, as shown in FIG. 3. Thereby, a tremendous calculation time is required to perform an optical simulation to the L/C pattern. A calculation region restriction part 14 therefore restricts a calculation region.

Figure 4:
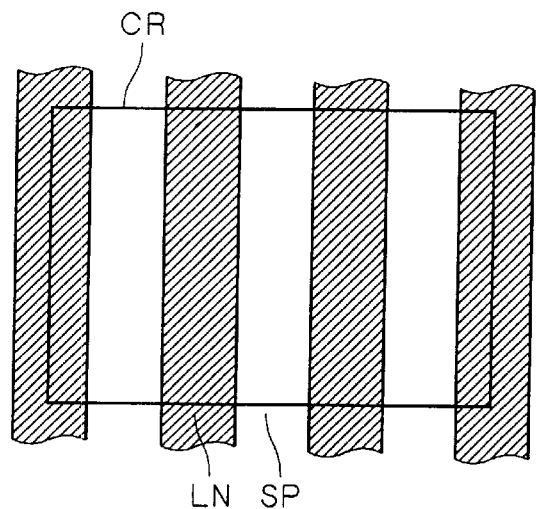

FIG. 4 shows schematically a L/S pattern of which calculation region is restricted. The restriction of calculation region can be executed by restricting with the number of occurrence of a pattern, with area, or both of these. FIG. 4 shows, for convenience, a calculation region CR of the size including three spaces SP.

If restricted with the number of occurrence of a pattern, in the shape of a calculation region, the length in the direction of an array of lines is determined by: (the number of occurrence of pattern)×(L+S). Therefore, the line length is made equal to that, such as to form a square, in some instances. It may be, of course, formed into a rectangle as shown in FIG. 4.

The size of a calculation region is usually determined per simulator. The calculation region restriction part 14 can be therefore omitted by generating a L/S pattern corresponding to the size of a calculation region, in the L/S pattern generation part 13.

Through the foregoing operation, the data of the L/S pattern in the calculation region CR (L/S pattern data DT1) is outputted from the automatic L/S pattern generation part 1.

<A-2. Operation of Optical Simulation Part>

Figure 5:
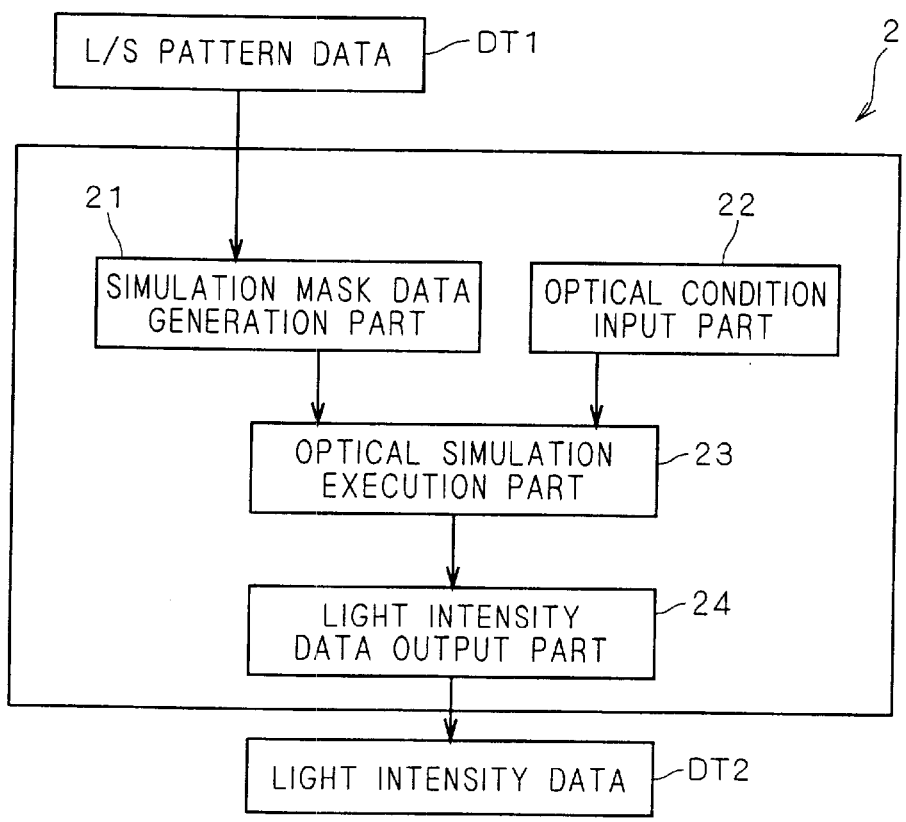
FIG. 5 is a diagram illustrating the construction of another design rule generation system according to the invention.

FIG. 5 is a block diagram illustrating the construction of an optical simulation part 2. As shown in FIG. 5, the optical simulation part 2 has a mask data for simulation generation part 21 in which a L/S pattern data DT1 outputted from an automatic L/S pattern generation part 1 is converted into data of a mask pattern for optical simulation (mask data), and an optical condition input part 22 for inputting optical conditions for optical simulation.

The mask data generated in the mask data for simulation generation part 21 corresponds, for example, to the L/S pattern in the calculation region CR shown in FIG. 4, and it is used for forming a mask pattern defined by line masks LM covering lines and mask spaces MS permitting light to transmit which are disposed between the line masks LM, as shown in FIG. 6(a). When the Levenson method or half tone method is employed, a peculiar data, such as a phase shifter for partially changing the phase of an exposed light, is added to the mask data.

The optical conditions inputted from the optical condition input part 22 are general conditions such as focus position, the wavelength of exposed light, the number of apertures of the optical system of an exposure system (NA), and sigma (σ). In addition to the general conditions, the shape of apertures or the like are inputted when the modified illumination method is employed.

Based on the mask data and optical conditions, an optical simulation is executed in an optical simulation execution part 23. The optical simulation calculates how the exposed light irradiated to a mask pattern is formed on an image surface of an optical system in photolithography, e.g., on a resist. The calculation result is outputted, as a light intensity data DT2, from a light intensity data output part 24, and it is possible to obtain a light intensity distribution on the image surface, based on the light intensity data.

FIG. 6(B) gives an intensity distribution of an exposed light on an image surface, in such a fashion as to correspond to the mask pattern of FIG. 6(A). In FIG. 6(B), the ordinate represents light intensity and the abscissa represents the position on an image surface. As apparent from FIG. 6 (B), the exposed light has a peak value in the area of the mask spaces MS, and has a minimum value in the area of the line masks LM permitting no light to transmit.

Depending upon the wafer process, exposure energy may change, alternatively, focus may deviate in some cases. It is therefore necessary to consider an exposure margin and defocus margin.

When a consideration is given to a defocus margin, it is desirable to perform an optical simulation with respect to not only a just focus position but also a defocus position, by variously changing the focus position. For this, of the optical conditions inputted from the optical condition input part 22, a simulation in the optical simulation execution part 23 is repeated by changing only the data related to the focus position. A consideration of defocus margin will be discussed later in detail.

<A-3. Operation of Finish Prediction Part>

FIG. 7 is a block diagram of the construction of a finish prediction part 3. As shown in FIG. 7, the finish prediction part 3 has a threshold value setting part 31 which generates a light intensity distribution based on a light intensity data DT2 outputted from an optical simulation part 2, and sets a predetermined light intensity (referred to as threshold value) to the light intensity distribution.

Figure 8:
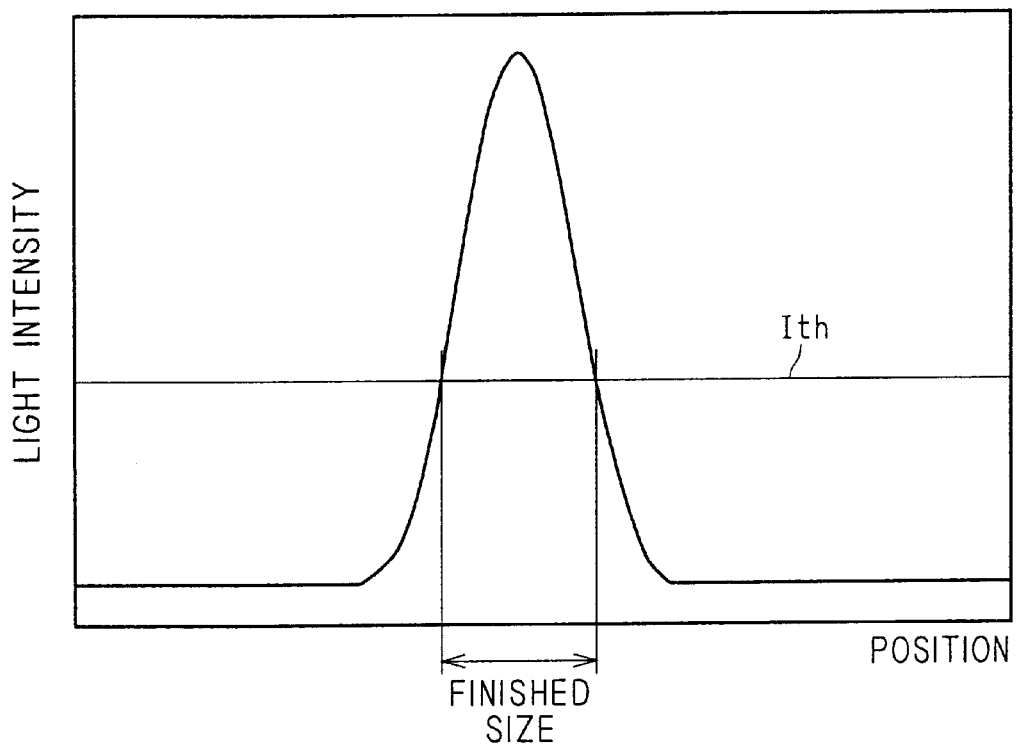
FIGS. 8 and 9 are schematic views illustrating operation of the design rule generation system.

Operation of setting a threshold value to a light intensity distribution is given in FIG. 8, in which the ordinate represents light intensity and the abscissa represents the position in an image surface.

As shown in FIG. 8, the setting of a threshold value Ith to a light intensity distribution is slicing a peak of the light intensity distribution at a predetermined position. The contour of the sliced section shows a so-called contour of light intensity, and the section width corresponds to a so-called finished size.

Accordingly, a contour is determined by setting a threshold value Ith, and the contour is outputted as a finished shape, from a contour output part 32 (see FIG. 7).

The finished shape outputted from the contour output part 32 is a two-dimensional shape of a mask pattern. However, actually needed in a L/S pattern are a section width of a light intensity distribution to be sliced by a threshold value, and the finished sizes of line and space obtained from the section width. Therefore, in a finished size calculation part 33 shown in FIG. 7, the finished sizes of line and space are calculated from the finished shape data outputted from the contour output part 32, and then outputted as a finish prediction data DT4. As shown in FIG. 6, the abscissa of the light intensity distribution corresponds to a position on an image surface. It is therefore easy to calculate a finished size from a section width.

The setting value of a threshold value Ith is determined based on an exposure energy and the sensitivity of a resist. Note that an optical simulation contains no information of a resist nor exposure energy. Thus, in setting a threshold value, the threshold value is required to be associated with an exposure energy, and the association between the exposure energy and threshold value is previously prepared as data DT3 of the threshold value to the exposure energy.

In order to obtain the association between the exposure energy and the threshold value, finished size is measured by changing exposure energy variously on a predetermined resist, to find the association between the exposure energy and the finished size, and an optical simulation is made to calculate the finished size when threshold value is changed variously, thereby comparing with the finished size obtained by the measurement.

<A-3-1. Preparation for Consideration of Exposure Margin>

A finished size is obtainable by setting a single threshold value corresponding to an exposure energy. It is, however, necessary to consider an exposure margin on the assumption that exposure energy changes depending upon the wafer process.

When a consideration is given to an exposure margin, it is required to find a plurality of finished sizes by changing threshold value variously. To this end, there are repeated the operation comprising the steps of changing the setting of a threshold value in a threshold value setting part 31, outputting the contour corresponding to the changed threshold value in a contour output part 32, and calculating the finished sizes of line and space in a finished size calculation part 33.

Figure 9:
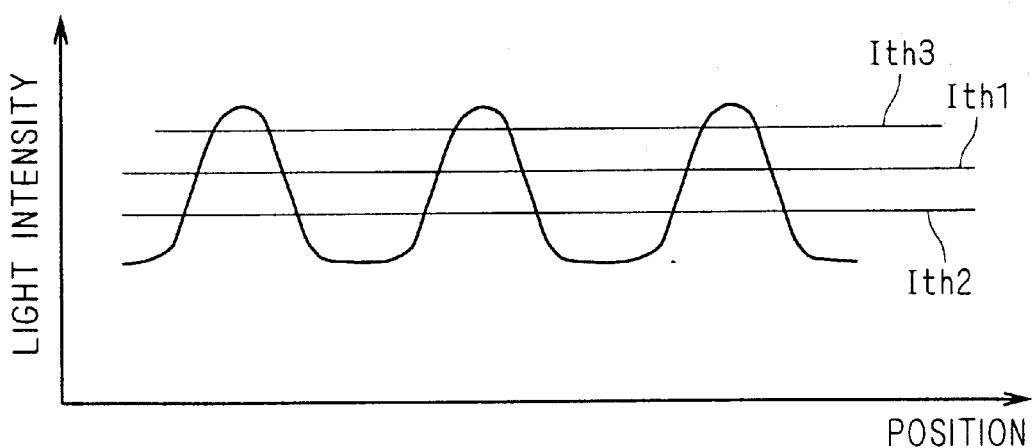

As an example, an image obtained when setting three kinds of threshold values is given in FIG. 9, in which the ordinate represents light intensity and the abscissa represents the position in an image surface. The light intensity distribution corresponds to the mask pattern shown in FIG. 6(*a*). Threshold values Ith1, Ith2 and Ith3 are set to the light intensity.

In the finished size calculation part 33, from the section widths obtained when the light intensity distribution is sliced with the threshold values Ith1, Ith2 and Ith3, respectively, the finished sizes of line and space are calculated, and these are outputted as a finish prediction data.

Note that the threshold values Ith1, Ith2 and Ith3 are illustrated as an example, and it is possible to increase the precision of a consideration of an exposure margin by increasing the number of threshold values.

<A-3-2. Preparation for Consideration of Defocus Margin>

When a consideration is given to a defocus margin, an optical simulation is made with respect to not only a just focus position but also a defocus position, by changing the focus position variously, in an optical simulation part 2 (see FIG. 5) as previously described. The obtained light intensity distribution is given in FIG. 10.

Figure 10:
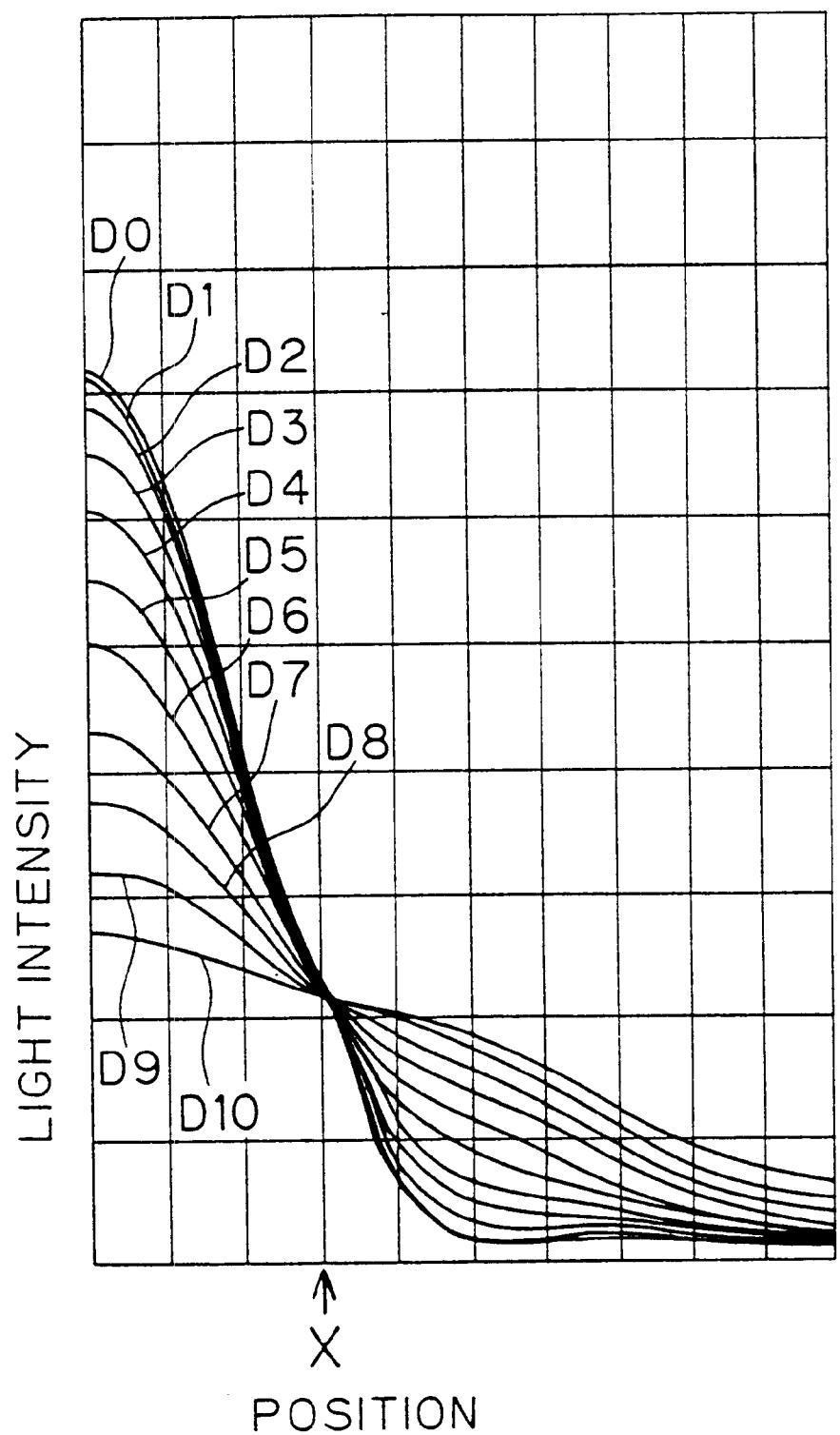
FIGS. 10 and 11 are diagrams showing the result of a simulation of light intensity distribution in the case of defocus.
Figure 11:
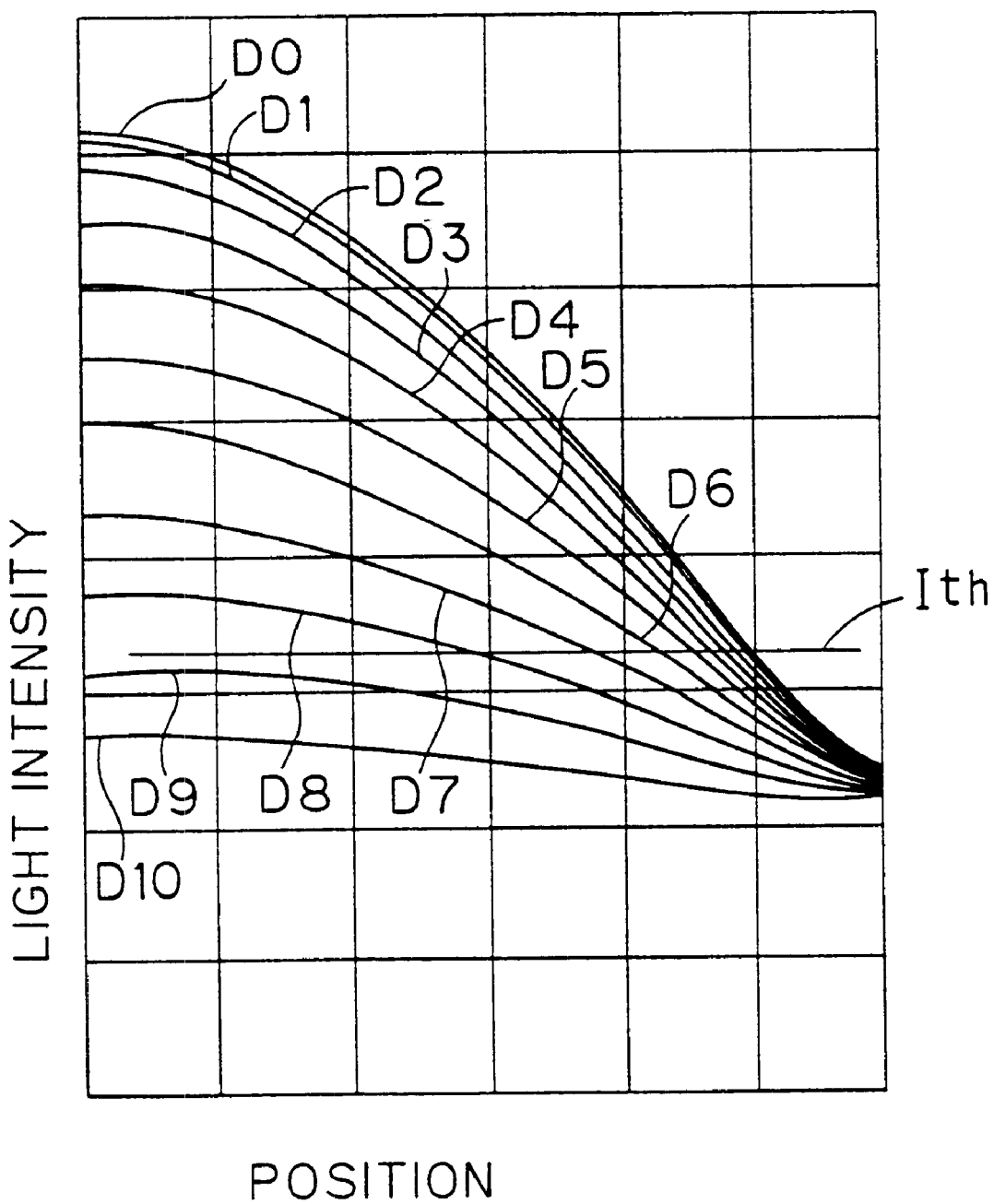

FIG. 10 shows an intensity distribution on an image surface of an exposed light passing through a mask space of a mask pattern, when the defocus amount is changed. FIG. 10 gives distribution characteristics D0 to D10 corresponding to the defocus amount of eleven kinds, respectively. FIG. 11 gives a partially enlarged view of the left side from the position indicated by the arrow X in FIG. 10.

In FIGS. 10 and 11, in which the ordinate represents light intensity and the abscissa represents the position in an image surface, the distribution characteristic D0 indicates the state when the defocus amount is zero, that is, the state of a just focus, and the distribution characteristics D1 to D10 indicate the case where the defocus amount is increased at predetermined intervals.

As shown in FIG. 11, the intensity of an exposed light decreases as the defocus amount increases from the point at which the defocus amount is zero (D0). Thereby, the pattern finished size is changed accordingly.

FIG. 11 shows an image when the threshold value Ith is set. In the finished size calculation part 33 (see FIG. 7), from the section widths obtained by slicing the distribution characteristics D1 to D10 with the threshold value Ith, respectively, the finished sizes of line and space are calculated, and then outputted as a finished prediction data.

<A-4. Operation of L/S Matrix Database Construction Part>

Figure 12:
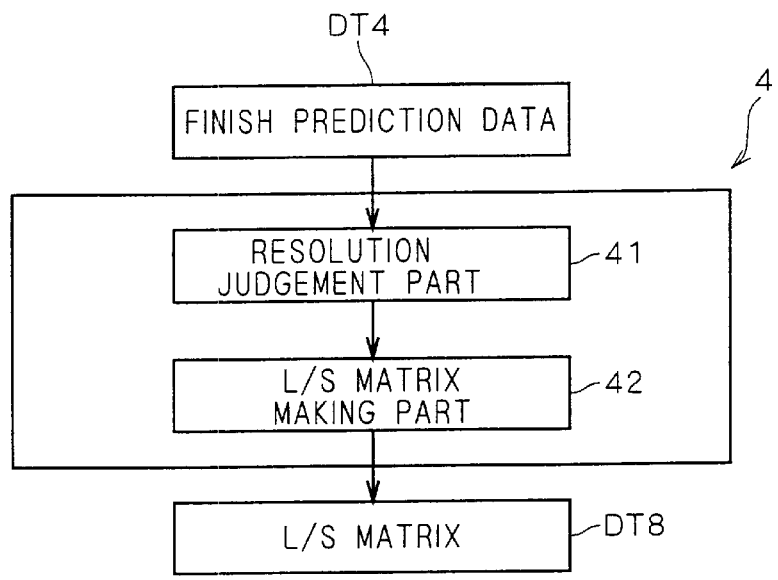
FIGS. 12 and 13 are diagrams illustrating the construction of another design rule generation system according to the invention.

FIG. 12 is a block diagram illustrating the construction of a L/S matrix database construction part 4. Referring to FIG. 12, a resolution judgement part 41 performs a judgement of resolution as to whether a finished prediction data DT4 outputted from a finish prediction part 3 satisfies a predetermined criterion. Based on the judgement result, a L/S matrix making part 42 makes a L/S matrix and then outputs a L/S matrix data DT8.

Figure 13:
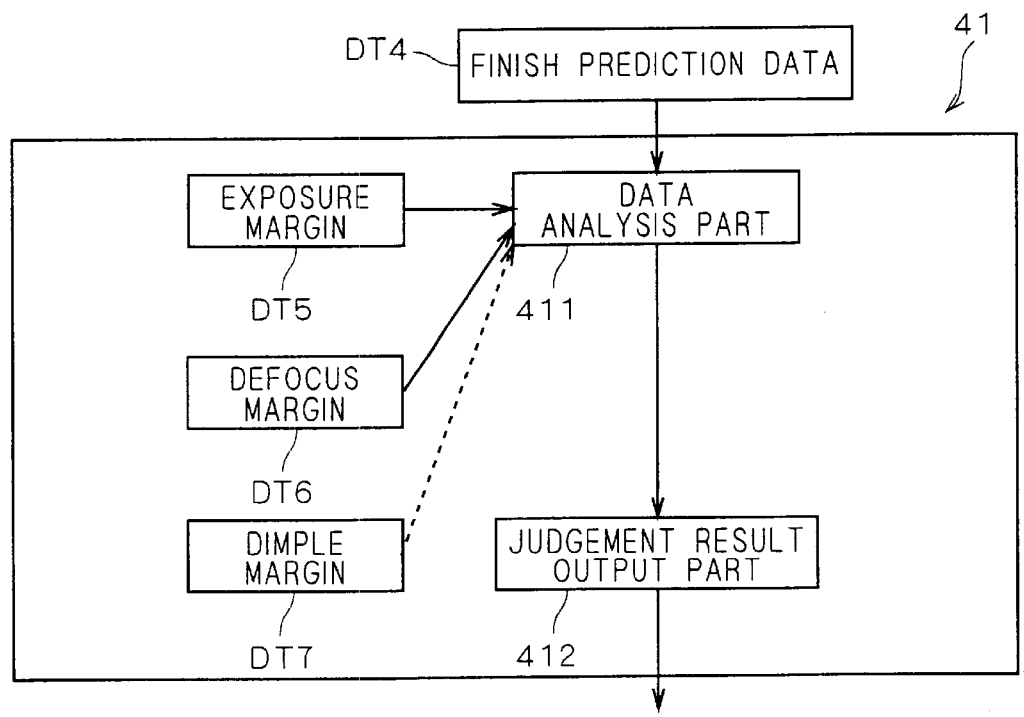

FIG. 13 is a block diagram illustrating the construction of a resolution judgement part 41. As shown in FIG. 13, the resolution judgement part 41 has a data analysis part 411 which receives a finish prediction data DT4 from the finish prediction part 3, and preset exposure margin data DT5 and defocus margin data DT6, and then performs a data analysis to judge whether the line and space of a mask pattern is resolvable or not.

<A-4-1. Operation of Judgement Taking Exposure Margin into Consideration>

Figure 14:
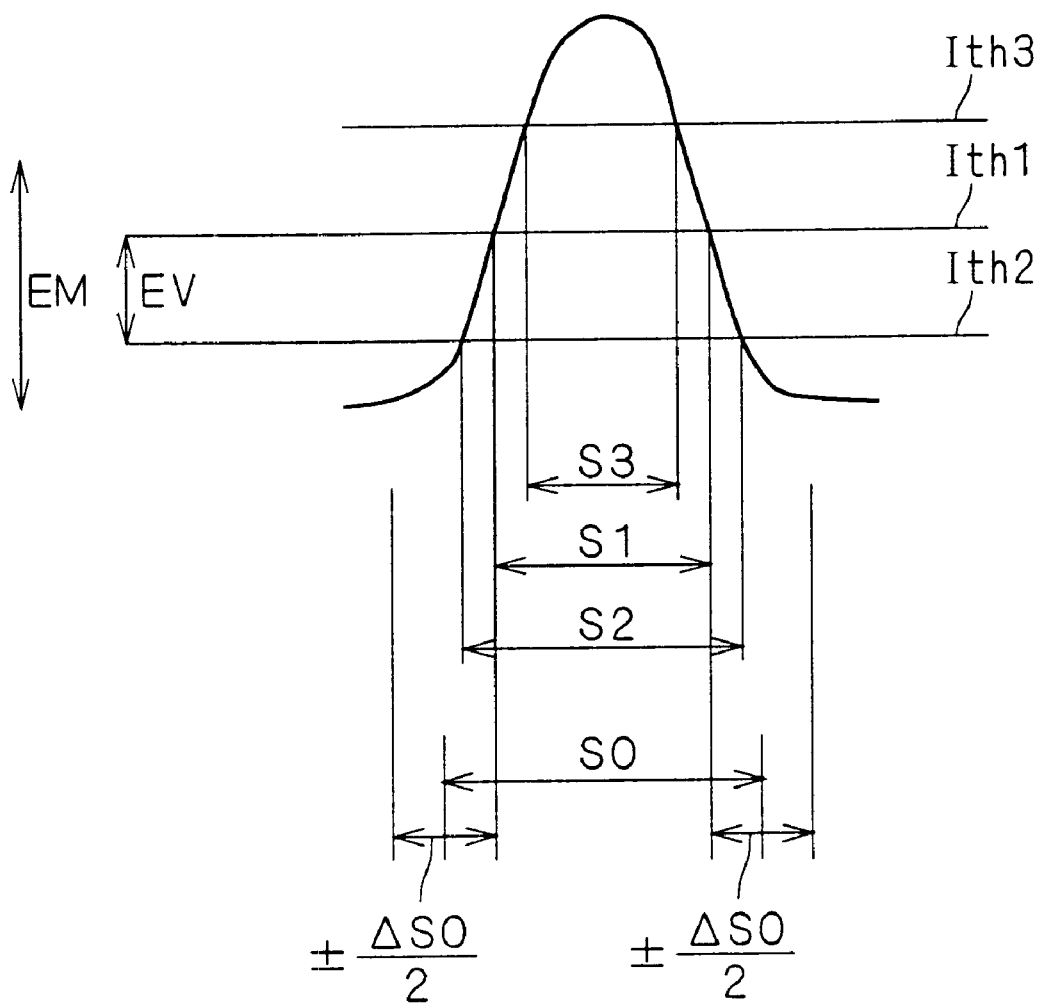
FIG. 14 is a diagram illustrating operation of determination taking an exposure margin into consideration.

An example of operation of judgement of a resolution judgement part 41, taking an exposure margin into consideration, is described by referring to FIG. 14, depicting one peak of a light intensity distribution in FIG. 9. In FIG. 14, the section widths obtained by slicing the light intensity distribution with threshold values Ith1, Ith2 and Ith3, respectively, that is, finished sizes (herein, space widths), are indicated by S1, S2 and S3, respectively; the size of a mask space in a mask pattern is indicated by S0; and an allowed variational dimension of the finished size to the mask space size is indicated by ±ΔS0.

As apparent from FIG. 14, of the finished sizes S1 to S3, S1 and S2 fall within a mask space size S0±ΔS0, and the corresponding threshold values are Ith1 and Ith2. A data analysis part 411 judges that the finish sizes S1 and S2 fall within the mask space size S0±ΔS0, by executing matching between a finish prediction data DT4 and an allowed variation dimension of a finished size.

Since the relationship between the exposure energy and the threshold value is already found as data DT3 (see FIG. 7), the exposure energy corresponding to the threshold value Ith1 and Ith2 are found respectively. In the data analysis part 411, letting the range of the exposure energy corresponding to the threshold values Ith1 and Ith2 be an allowed variational exposure energy EV, it is judged whether the value EV falls within a preset exposure margin EM (i.e., whether a first condition is satisfied or not).

Although the foregoing description discusses only the light intensity distribution of a mask space part in a mask pattern, namely, a space part in a L/S pattern, a similar analysis is applicable to a line mask part allowing no light to transmit, namely, a line part in a L/S pattern.

<A-4-2. Operation of Judgement Taking Defocus Margin into Consideration>

Operation of a resolution judgement part 41, taking a defocus margin into consideration, is the same as above. In a data analysis part 411, from a plurality of finished sizes (herein, space widths) obtained by slicing the distribution characteristics D1 to D10 shown in FIG. 11, with a threshold value Ith, one which falls within the range of a mask space size S0±ΔS0 is selected by executing matching between a finish prediction data DT4 and an allowed variational dimension of the finished size. Letting the range of the defocus amount showing the distribution characteristic corresponding to the selected finished size, be an allowed variational defocus amount, it is judged whether this value falls within a preset defocus margin range (i.e., whether a second condition is satisfied or not).

Then, the data analysis part 411 judges that the L/S pattern satisfying the first and second conditions is resolvable, and outputs the result from a judgement result output part 412.

It is also possible to judge that the L/S pattern satisfying only the first or second condition is resolvable.

When no consideration is given to an exposure margin nor defocus margin, the resolvability is judged by determining, in the data analysis part 411, whether a finished size S1 corresponding to the threshold value Ith falls within the range of a mask space size S0±ΔS0.

Figure 15:
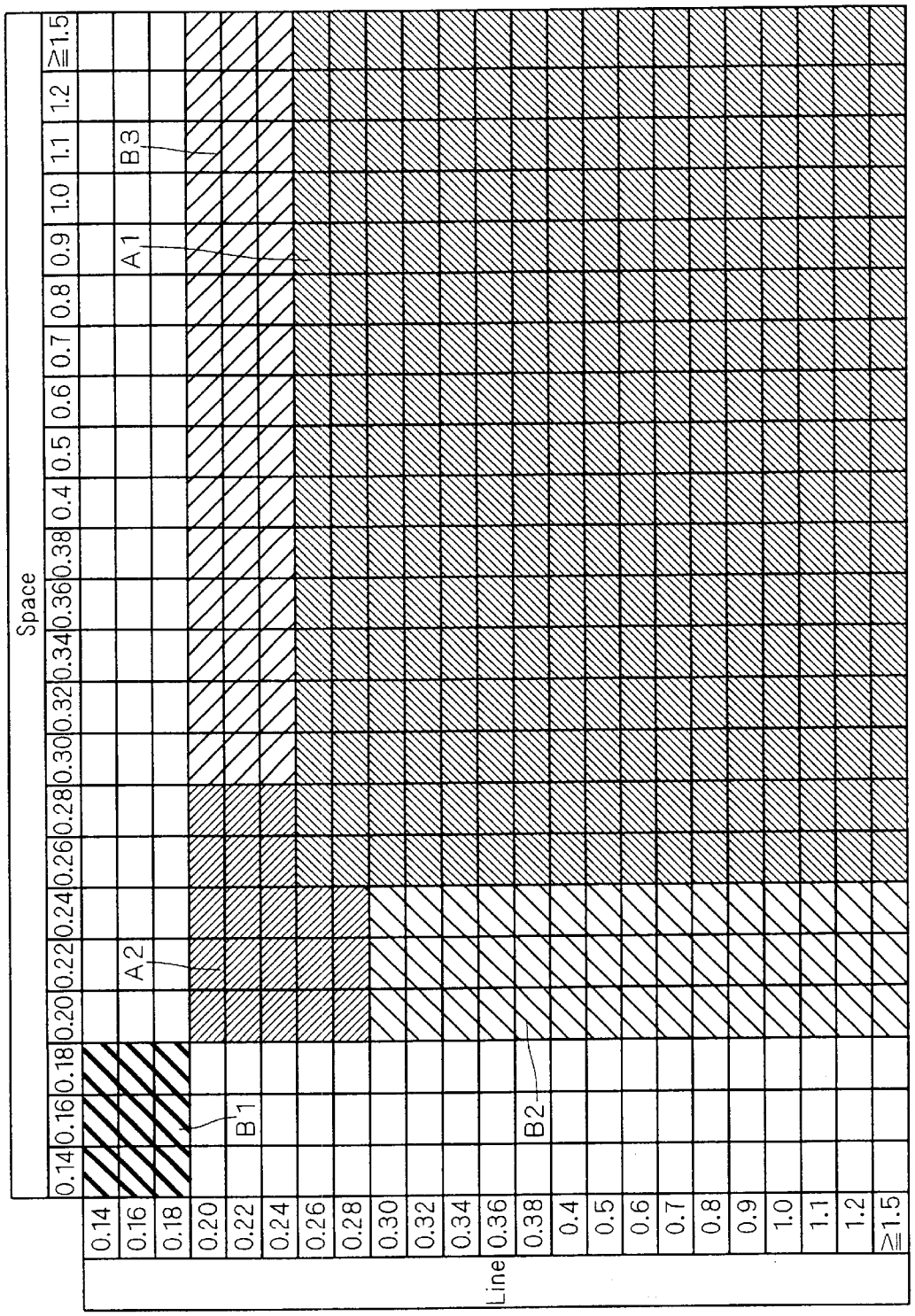
FIG. 15 is a diagram illustrating a L/S matrix when a super resolution technique is employed.

The mentioned operations of the optical simulation part 2, finish prediction part 3, L/S matrix database construction part 4 are executed in the combinations of line width and space width that are generated in the automatic L/S pattern generation part 1, thereby obtaining a L/S matrix as shown in FIG. 15.

FIG. 15 gives a L/S matrix when the modified illumination method is employed as a super resolution technique. Regions A1 and A2 of the hatched part correspond to the region covering the combinations of line width and space width, with which an optical image of a pattern defined by lines and spaces is resolvable on a resist. The region A2 is such a region that surrounds the corner of the region A1.

Although the operation of determination in the data analysis part 411 is automatically executed based on an exposure margin and defocus margin that are set to a finish prediction data, the finish prediction data and the data of the exposure margin and defocus margin may be shown graphically in a display, such that the user of the present system can check by visual observation.

<A-5. Operation of Design Rule Generation Part>

Referring to FIG. 16, operation of a design rule generation part 5 is described. An unresolvable region determination part 51 determines an unresolvable region with respect to a L/S matrix data DT8 generated in a L/S matrix database construction part 4. It is already found that in the L/S pattern shown in FIG. 15, the region other than the regions A1 and A2 is an unresolvable region. However, all unresolvable regions need not be defined as a design rule. For example, it is unnecessary to specially define, as a design rule, the region of the combination of the line width and space width which is not used as a layout pattern. Therefore, the unresolvable region determination part 51 (see FIG. 16) eliminates such a region in determining an unresolvable region required to be defined as a design rule.

Subsequently, a DR generation part 52 sets a design rule of the determined unresolvable region. When the form of defining a disabled region is taken as a design rule, for example, the following three equations can be set down as a rule:

$$L, S < 0.20 \mu m \quad (1)$$

$$L \geq 0.3 \mu m, 0.20 \mu m \leq S < 0.26 \mu m \quad (2)$$

$$0.20 \mu m \leq L < 0.26 \mu m, S \geq 0.30 \mu m \quad (3)$$

These three equations correspond to the L/S pattern of FIG. 15, that is, the equations (1), (2) and (3) correspond to the region B1, B2 and B3, respectively.

All the three equations or any one or two of them may be, of course, incorporated into a design rule.

After setting a design rule, a DR verification part 53 verifies whether the design rule shows a region consistent with the unresolvable region of the L/S matrix.

This is a confirmation as to whether the design rule is set appropriately. Specifically, this is the operation to verify whether or not the resolvable regions (A1 and A2) are set such as to be contained in the disabled regions (B1, B2 and B3). To provide for this, a L/S matrix is made from the design rule, and it is verified whether or not this L/S matrix is consistent with the L/S matrix of FIG. 15.

Depending upon the software for verification, it is impossible to make a table completely consistent with the L/S matrix of FIG. 15, because of the restriction upon software or the like, for example, for the reason that the line width and space width of not less than 1.0 $\mu$m cannot be verified. In such a case, a matching with a verification software is made as to whether inconsistence is caused by a problem inherent in the verification software or an error during the design rule setting. As a result, if the set design rule has a problem, another design rule is set in the DR generation part 52.

When the DR verification part 53 verifies that the design rule has no problem, the design rule is determined and outputted from a DR output part 54.

The data of the determined design rule is used not only the layout design of a semiconductor circuit pattern (step S2) but also the layout verification of the layout pattern (step S3) and the verification and inspection of a manufactured semiconductor circuit (step S6), as previously described with reference to FIG. 1.

<A-6. Effects>

In a conventional manner to obtain a design rule, the designer sequentially makes an optical simulation to various combinations of line width and space width, to make an L/S matrix, and then determines whether resolution is executable or not in the respective combinations of line width and space width, by using the L/S matrix. Based on the results, a design rule is determined empirically. On the other hand, with the design rule generation system of the present invention, a L/S matrix is automatically generated and a design rule is automatically determined. This increases the efficiency of operation of determining the design rule, and reduces the time needed in determining the design rule.

The employment of the design rule generation system of the invention also enables a positive utilization of an optical proximity correction (OPC). That is, in the miniaturization of a pattern, for the optical reason and development or etching process reason, the corner of a right angle pattern is rounded, or an optical proximity effect (OPE) occurs which causes a pattern to be thinned or thickened. To overcome this, OPC for complicating the shape of the mask pattern of a location having a tendency to cause OPE is used. The use of OPC requires information about the degree of resolution under the present process condition. The system of the invention performing an automatic generation of a L/S matrix makes it easy to acquire this information, thus permitting a positive utilization of OPC.

In making a L/S matrix, all matrixes may be filled with the simulation result. In various combinations of line width and space width, only simulation for which involves the problem of precision, resolvability may be determined by measurement.

Determination of resolvability need not be necessarily made for all L/S matrixes, and it may be limited to the contour part of a resolvable region or unresolvable region.

<A-7. First Modification>

In the mentioned design rule generation system of the invention, the finish prediction part 3 shown in FIG. 7 predicts a finished size by generating a light intensity distribution based on a light intensity data DT2, and setting a threshold value to the light intensity distribution.

It is already confirmed that with this method, a resist of high sensitivity can provide a relatively close match with a resist pattern to be formed actually. To further increase precision, it is now proposed to consider resist characteristics.

Figure 17:
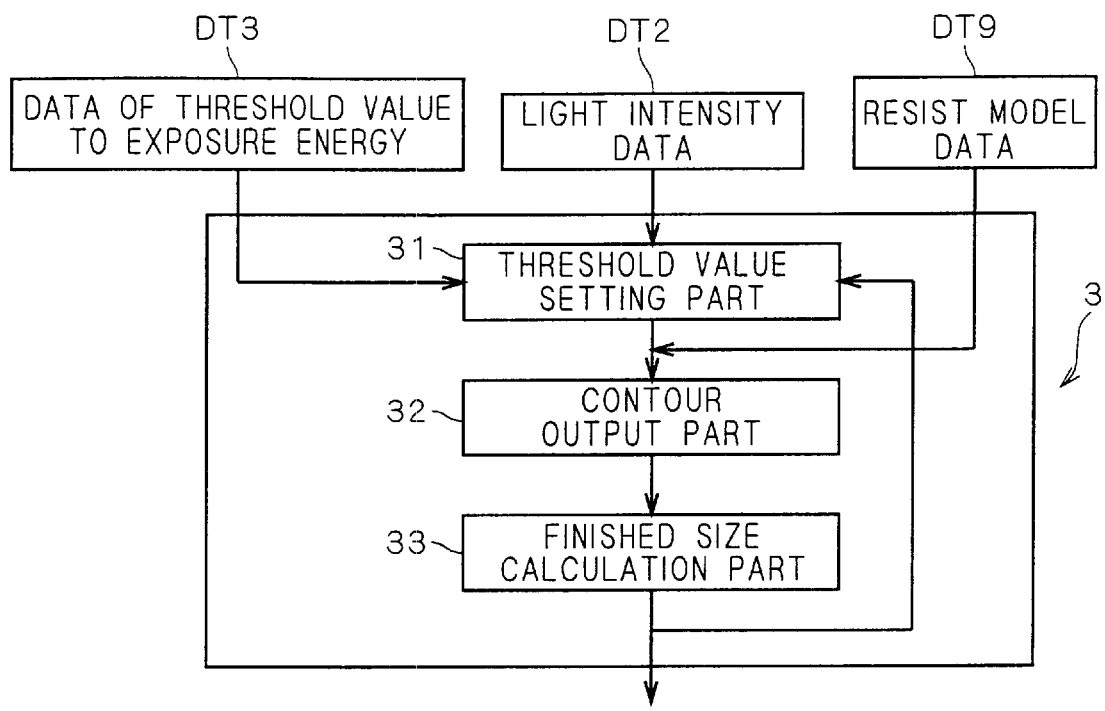
FIG. 17 is a diagram illustrating the construction of a modified design rule generation system according to the invention.

For instance, as shown in FIG. 17, when a threshold value is set and a contour is determined in the finish prediction part 3, there is employed a resist model data DT9, being called a simple resist model, which contains the resist effect and etching effect related to resolvability, and a threshold value is changed according to the magnitude of a pattern, thereby permitting a finish predication coincident with the resist characteristics. Since a variety of simple resist models are known, they may be suitably selected according to a resist.

<A-8. Second Modification>

While the setting of a design rule of a basic L/S pattern (vertical or level line) is discussed in the mentioned design rule generation system of the invention, there are some patterns to which the design rule of a basic L/S pattern is not applicable.

Figure 18:
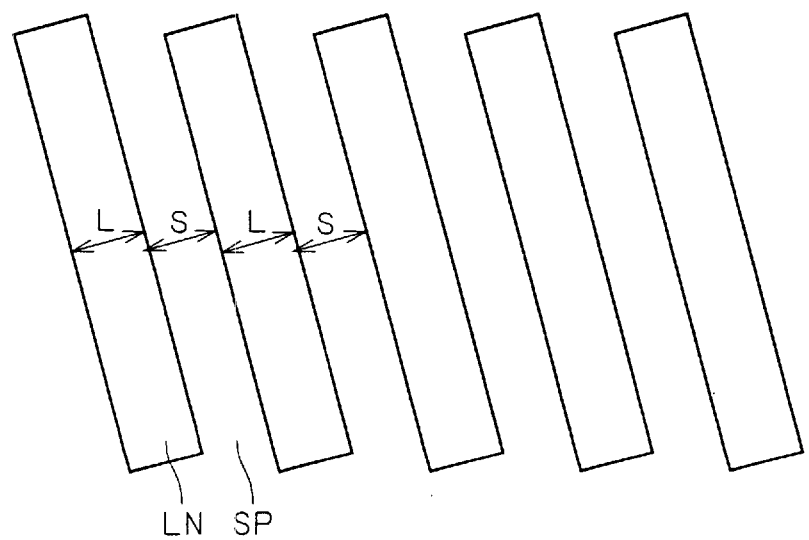
FIG. 18 is a diagram illustrating a pattern having oblique lines.

Its typical representative example is a L/S pattern of oblique lines, as shown in FIG. 18. When the modified illumination method is used in the L/S pattern (line width and space width are indicated by L and S, respectively) which has a plurality of lines LN and spaces SP arrayed obliquely, as shown in FIG. 18, a finished size depends upon the direction of incidence of light. Therefore, a design rule set such as to correspond to a basic L/S pattern is unsuitable for L/S pattern of oblique lines.

To provide for this, another design rule may be set for the L/S pattern of an oblique line individually by using the design rule generation system of the invention. In the present system, the same operation as the basic L/S pattern is performed for a L/S pattern of an oblique line, to set a design rule. A distinctive point is that a L/S pattern is generated so as to correspond to the angle of the oblique lines, in the automatic L/S pattern generation part 1. As a result, if various oblique lines are present, a L/S matrix is made per the angle of an oblique line. By virtue of the automation of L/S matrix making, a great cost increase in making a design rule is avoidable.

<A-9. Third Modification>

While only the setting of a design rule of a basic L/S pattern is discussed in the mentioned design rule generation system of the invention, this system is applicable to the setting of a design rule of a hole pattern.

Figure 19:
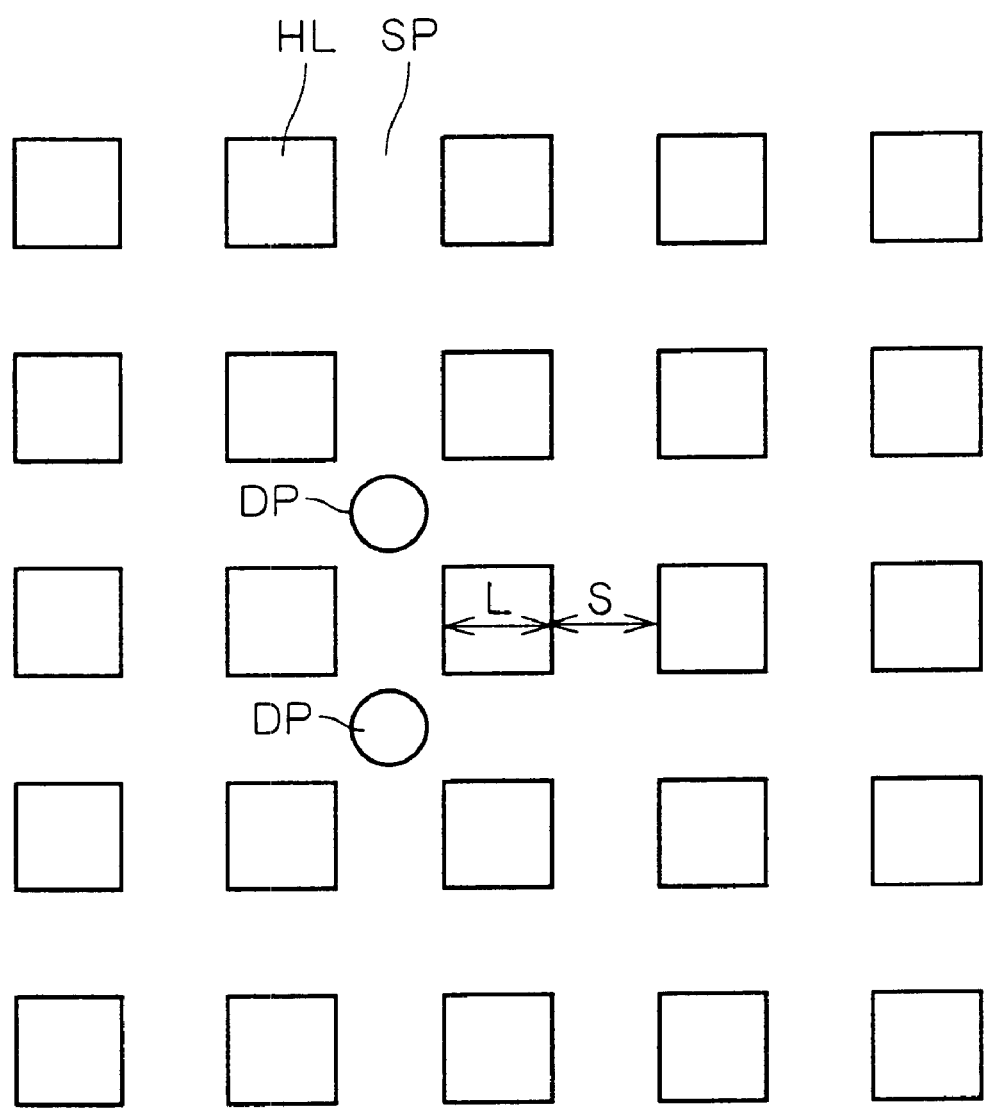
FIG. 19 is a diagram illustrating a pattern having a hole pattern.

Specifically, as shown in FIG. 19, on the assumption that holes are of square, its width and space width between holes are represented by L and S, respectively, thereby a L/S matrix can be made in the same manner as a L/S pattern.

When half tone technique is employed, however, it is necessary to consider the presence/absence of a dimple. In the half tone technique, a shading part of a mask is formed with a material which is semitransparent (having a translucent of several percent) to the exposed light, and of which phase is reversed to the exposed light passing through an aperture, so that interference is eliminated by deviating the phase of diffraction light in adjacent apertures, thereby separating the images of the adjacent apertures one from the other. Since a small amount of light is allowed to pass through the shading part, in some cases, the secondary peak of light is overlapped and a pattern is formed on a location having no hall pattern. This is a dimple (DP), which often occurs in space surrounded by four holes, as shown in FIG. 19.

It is desirable to suppress the occurrence of a dimple DP. Therefore, in the resolution judgement part 41 described with reference to FIG. 13, a dimple margin data DT7 is also considered as well as an exposure margin and defocus margin. A consideration of a dimple margin is executed by confirming as to whether part having a light intensity over a predetermined value in the light intensity distribution of space part between holes, and the predetermined value serves as a dimple margin. Since the light intensity of the space part is usually near zero, it is judged only with zero or other binary, namely, the presence/absence of a dimple. The presence/absence of a dimple can be easily confirmed by visual observation, and thus the operation of determination in the data analysis part 411 may be executed by visual observation of a finish prediction data that is indicated graphically on a display.

In addition, if it assumed that the hole shape is of a rectangle, the system of the invention is applicable. In this case, a dimple margin might be different from that of the square. Therefore, a simulation is made after optimizing the setting of a dimple margin.

<A-10. Fourth Modification>

While the case of having data of resolvability of a L/S matrix is discussed in the mentioned design rule generation system of the invention, a L/S matrix may be constructed such as to have other data. An image of such a construction is given in FIG. 20.

Figure 20:
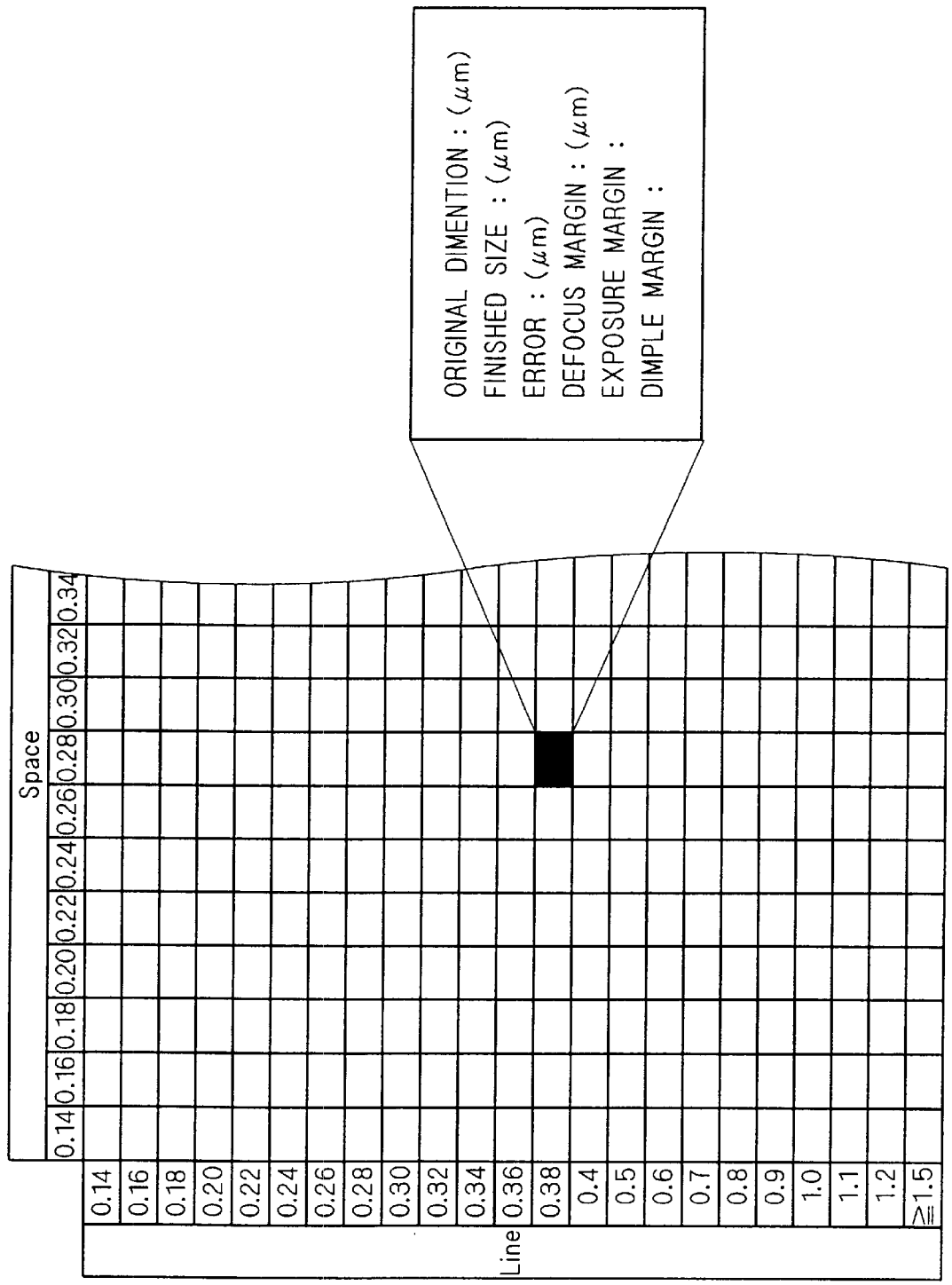
FIG. 20 is a schematic view illustrating a database contained in a L/S matrix.

FIG. 20 is a diagram illustrating, as an image, one example of data contained in one cell of a L/S matrix. Contained therein are data about the full scale of a L/S pattern (unit: μm, for example), a finished size (unit: μm, for example), a dimensional error of the finished size to the original dimention (unit: μm, for example), a defocus margin, an exposure margin, and a dimple margin. These data are all generated in the process to determine resolvability, or provided from the exterior, thus requiring no new system for obtaining these data.

Having such a database, it can be utilized as information used in OPC, for example.

<A-11. Example of Realization of Design Rule Generation System>

Figure 21:
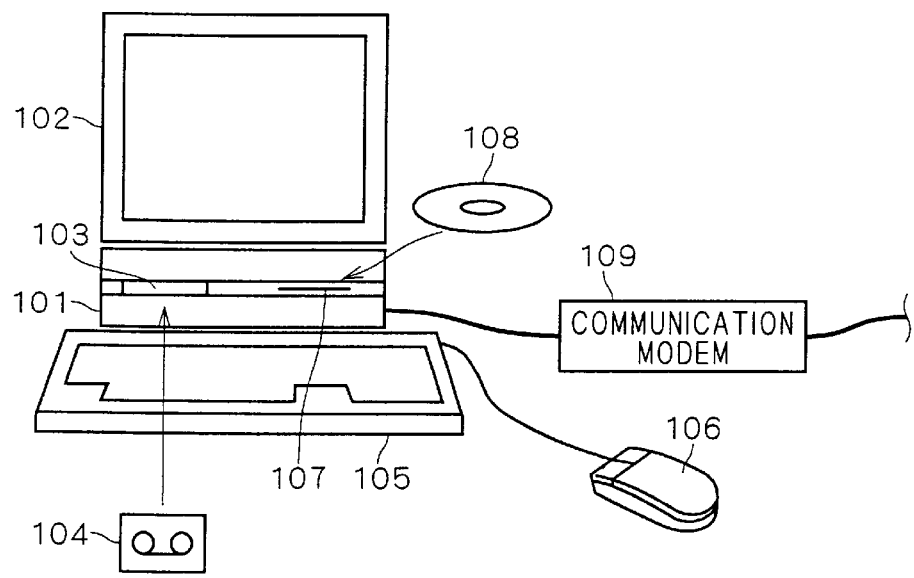
FIG. 21 is a diagram of the appearance of a computer system realizing a design rule generation system according to the invention.

In realizing the mentioned design rule generation system of the invention, a computer system as shown in FIG. 21 may be utilized, for example.

In FIG. 21, a design rule generation system 100 comprises a computer unit 101, display 102, magnetic tape unit 103 into which a magnetic tape 104 is inserted, keyboard 105, mouse 106, CD-ROM (compact disk-read only memory) unit 107 into which a CD-ROM 108 is inserted, and a communication modem 109.

The functions of an automatic L/S pattern generation part 1, optical simulation part 2, finish prediction part 3, L/S matrix database construction part 4 and design rule generation part 5, all of which constitute the design rule generation system 100, can be realized by executing a computer program on a computer. In this case, the program is supplied by a recording medium such as the magnetic tape 104 or CD-ROM 108. Alternatively, the program can be propagated, in the form of signals, on a communication channel, and then downloaded to a recording medium.

A design rule generation program is executed on the computer unit 101, and a design rule is automatically generated by that the operator operates the keyboard 105 or mouse 106 while watching the display 102. Alternatively, a design rule generation program may be supplied to the computer unit 101 via the communication modem 109, from a communication line of another computer.

Figure 22:
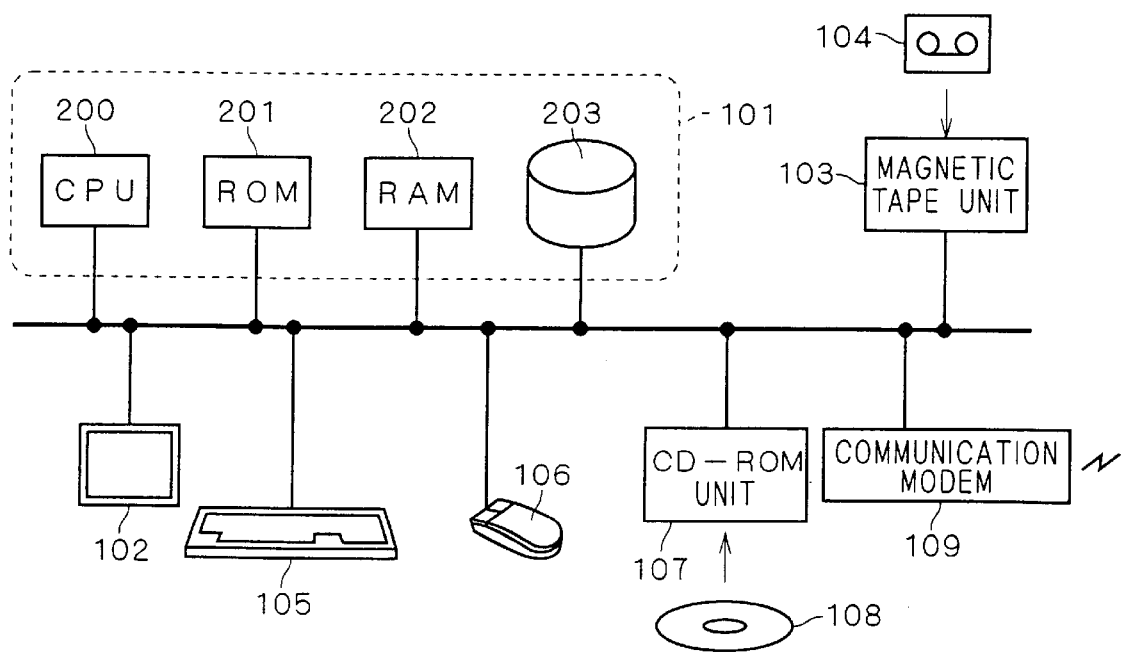
FIG. 22 is a diagram illustrating the construction of a computer system realizing a design rule generation system according to the invention.

FIG. 22 is a block diagram illustration the construction of the computer system of FIG. 21. The computer unit 101 shown in FIG. 21 has a CPU (central processing unit) 200, ROM (read only memory) 201, RAM (random access memory) 202, and hard disk 203.

The CPU 200 performs processing through the input/output of data among the display 102, magnetic tape unit 103, keyboard 105, mouse 106, CD-ROM unit 107, communication modem 109, ROM 201, RAM 202, and hard disk 203.

The design rule generation program recorded in the magnetic tape 104 or CD-ROM 108 is temporarily stored in the hard disk 203 by the CPU 200. The CPU 200 generates a design rule by suitably loading a design rule generation program from the hard disk 203 to the RAM 202, and executing the program.

The computer system in the foregoing is given only as an example and without limitation. Any one which can execute a design rule generation program is useable.

While the invention has been shown and described in detail, the foregoing description is in all aspects illustrative and not restrictive. It is therefore understood that numerous modifications and variations can be devised without departing from the scope of the invention.

What is claimed is:

1. A design rule generation system comprising:
   (a) an automatic wiring pattern generation part that automatically generates a wiring pattern comprised of a combination of a wiring width and a space width between said wirings;
   (b) an optical simulation part that performs an optical simulation under a condition of printing said wiring pattern on an object, and outputs data of an exposed light on said object;
   (c) a finish prediction part that predicts a finished size of said wiring pattern to be formed on said object, based on said data of said exposed light;
   (d) a matrix database construction part that records, on a data table in the form of a matrix, resolvability of a plurality of said wiring patterns having a different combination of said wiring width and said space width which are obtained by repeating the respective operations in said parts (a) to (c); judges whether said finished size satisfies a predetermined condition or not, so that it is determined said wiring patterns are resolvable if said predetermined condition is satisfied, and determined said wiring patterns are unresolvable unless said predetermined condition is satisfied; and records the resolvability of said wiring pattern on said data table, so as to correspond respectively to said combinations of said wiring width and said space width; and
   (e) a design rule generation part that generates a design rule by defining a range of a resolvable region comprised of a set of said wiring patterns being resolvable, or an unresolvable region comprised of a set of said wiring patterns being unresolvable, based on said data table.

2. The design rule generation system according to claim 1 wherein,
   said data of said exposed light outputted from said optical simulation part is data showing a light intensity distribution corresponding to a position on said object;
   said finish prediction part sets a predetermined light intensity in said light intensity distribution, as a threshold value, and employs a section width obtained by slicing said light intensity distribution with said threshold value, as said finished size; and said matrix database construction part determines resolvability of said wiring pattern by determining whether said section width is contained in a size obtained by summing said wiring width, said space width and a predefined allowed variational value.

3. The design rule generation system according to claim 1 wherein said matrix database construction part contains at least an exposure margin and defocus margin, as a criterion of determining resolvability of said wiring pattern.

4. The design rule generation system according to claim 3 wherein, said data of said exposed light outputted from said optical simulation part is data showing a light intensity distribution corresponding to a position of said object;

said finish prediction part sets a plurality of light intensity values in said light intensity distribution as a plurality of threshold values, respectively, and acquires a plurality of section widths by slicing said light intensity distribution with said threshold values; and said matrix database construction part determines resolvability of said wiring pattern by finding, out of said section widths, ones which fall within a range of a dimension obtained by summing said wiring width, said space width and a predefined allowed variational value, finding an allowed variational exposure energy from a range of threshold values corresponding to said section widths, and determining whether said allowed variational exposure energy is contained in said exposure margin.

5. The design rule generation system according to claim 3 wherein, said optical simulation part performs said optical simulation under a plurality of defocus conditions, to output data showing a plurality of light intensity distributions which correspond to said defocus conditions, respectively, and correspond to a position on said object;

said finish prediction part sets a predetermined light intensity in said light intensity distributions, as a threshold value, and acquires a plurality of section widths by slicing said light intensity distributions with said threshold value;

said matrix database construction part determines resolvability of said wiring pattern by finding, out of said section widths, ones which fall within a range of a size obtained by summing said wiring width, said space width and a predefined allowed variational value, finding an allowed variational defocus amount from a range of defocus conditions corresponding to said section widths, and determining whether said allowed variational defocus amount is contained in said defocus margin.

6. The design rule generation system according to claim 1 wherein said automatic wiring pattern generation part generates a wiring pattern of oblique lines in which said wiring and said space are disposed obliquely on a plain at a predetermined angle.

7. The design rule generation system according to claim 1 wherein said automatic wiring pattern generation part generates a hole pattern in which said wiring width and said space width are employed as the diameter of holes and the space width between said holes, respectively.

8. The design rule generation system according to claim 3 wherein said matrix database construction part contains the presence/absence of a dimple occurred in said space between holes, as a criterion of determining resolvability of said wiring pattern.

9. A recording medium recording a program for realizing on a computer the following functions:

(a) an automatic wiring pattern generation function of automatically generating a wiring pattern comprised of a combination of a wiring width and a space width between said wirings;

(b) an optical simulation function of performing an optical simulation under a condition of printing said wiring pattern on an object, and outputting data related to an exposed light on said object;

(c) a finish prediction function of predicting a finished size of said wiring pattern to be formed on said object, based on said data of said exposed light;

(d) a matrix database construction function of recording, on a data table in the form of a matrix, resolvability of a plurality of said wiring patterns having a different combination of said wiring width and said space width to be obtained by executing repetitively said functions (a) to (c); judging whether said finished size satisfies a predetermined condition or not, so that it is determined said wiring patterns are resolvable if said predetermined condition is satisfied, and determined said wiring patterns are unresolvable unless said predetermined condition is satisfied; and recording the resolvability of said wiring patterns on said data table, so as to correspond respectively to said combinations of said wiring width and said space width; and (e) a design rule generation function of generating a design rule by defining a range of a resolvable region comprised of a set of said wiring patterns being resolvable, or an unresolvable region comprised of a set of said wiring patterns being unresolvable, based on said data table.

* * * * *